(12) United States Patent
Takamine

(10) Patent No.: US 10,305,449 B2
(45) Date of Patent: May 28, 2019

(54) MULTIPLEXER, HIGH-FREQUENCY FRONT END CIRCUIT, AND COMMUNICATION APPARATUS

(71) Applicant: Murata Manufacturing Co., Ltd., Nagaokakyo-shi, Kyoto-fu (JP)

(72) Inventor: Yuichi Takamine, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/025,028

(22) Filed: Jul. 2, 2018

(65) Prior Publication Data

US 2019/0028086 A1   Jan. 24, 2019

(30) Foreign Application Priority Data

Jul. 20, 2017 (JP) ................... 2017-141334

(51) Int. Cl.
| | | |
|---|---|---|
| *H03H 9/02* | (2006.01) | |
| *H03H 9/05* | (2006.01) | |
| *H03H 9/64* | (2006.01) | |
| *H03H 9/70* | (2006.01) | |
| *H03H 9/72* | (2006.01) | |
| *H04B 1/00* | (2006.01) | |

(52) U.S. Cl.
CPC ........ *H03H 9/725* (2013.01); *H03H 9/02574* (2013.01); *H03H 9/0576* (2013.01); *H03H 9/6483* (2013.01); *H03H 9/706* (2013.01); *H04B 1/0057* (2013.01); *H03H 9/6416* (2013.01)

(58) Field of Classification Search
CPC .. H03H 9/0004; H03H 9/6483; H03H 9/6489; H03H 9/72; H03H 9/725; H03H 9/02574; H03H 9/0576; H03H 9/706; H03H 9/6416; H04B 1/0057

USPC .................................................. 333/133, 195
See application file for complete search history.

(56) References Cited

U.S. PATENT DOCUMENTS

| | | | |
|---|---|---|---|
| 6,380,823 B1 * | 4/2002 | Ikata ........................ | H03H 9/72 333/133 |
| 9,917,603 B2 * | 3/2018 | Araki ................... | H04B 1/0057 |
| 9,979,379 B2 * | 5/2018 | Yasuda ................... | H01P 1/213 |
| 2016/0182119 A1 * | 6/2016 | Handtmann ............. | H04B 1/48 375/220 |
| 2018/0109243 A1 | 4/2018 | Takamine | |
| 2018/0152210 A1 * | 5/2018 | Araki ................... | H04B 1/0057 |

FOREIGN PATENT DOCUMENTS

| | | |
|---|---|---|
| JP | 2003-283363 A | 10/2003 |
| WO | 2016/208670 A1 | 12/2016 |

\* cited by examiner

*Primary Examiner* — Barbara Summons
(74) *Attorney, Agent, or Firm* — Keating & Bennett, LLP

(57) ABSTRACT

A multiplexer includes a common terminal, a Band66 transmission-side filter, a Band30 transmission-side filter, and an inductance element. The Band66 transmission-side filter includes series arm resonators and parallel arm resonators. The frequency of spurious waves generated by the Band66 transmission-side filter is included in a pass band of the Band30 transmission-side filter. A transmission output terminal is connected to a common terminal with the inductance element interposed therebetween and is directly connected to one parallel arm resonator. The one parallel arm resonator has a largest capacitance, among the parallel arm resonators.

19 Claims, 11 Drawing Sheets

MULTIPLEXER, HIGH-FREQUENCY FRONT END CIRCUIT, AND COMMUNICATION APPARATUS

CROSS REFERENCE TO RELATED APPLICATIONS

This application claims the benefit of priority to Japanese Patent Application No. 2017-141334 filed on Jul. 20, 2017. The entire contents of this application are hereby incorporated herein by reference.

BACKGROUND OF THE INVENTION

1. Field of the Invention

The present invention relates to a multiplexer including an elastic wave filter, a high-frequency front end circuit, and a communication apparatus.

2. Description of the Related Art

Cellular phones in recent years are each required to support multiple frequency bands and multiple wireless communication methods, that is, multiband and multimode communication. In order to meet this requirement, a multiplexer that demultiplexes a high-frequency signal having multiple wireless carrier frequencies is disposed immediately after one antenna. Elastic wave filters having low loss in their pass bands are used as multiple band pass filters defining the multiplexer.

International Publication No. 2016/208670 discloses a surface acoustic wave apparatus (SAW duplexer) in which multiple surface acoustic wave filters are commonly connected to an antenna terminal.

In such an elastic wave filter, spurious waves caused by, for example, a higher order mode may occur at the high frequency side of the pass band of the filter and spurious waves caused by, for example, Rayleigh waves may occur at the low frequency side of the pass band of the filter.

In the multiplexer disclosed in International Publication No. 2016/208670 and in which multiple elastic wave filters are connected to a common terminal, the frequency of the spurious waves generated in one elastic wave filter may be included in the pass band of another elastic wave filter. In this case, reflection characteristics of the one elastic wave filter are degraded due to the spurious waves to increase insertion loss in the pass band of the other elastic wave filter. This causes a problem in that bandpass characteristics of the entire multiplexer are also degraded.

SUMMARY OF THE INVENTION

Preferred embodiments of the present invention provide multiplexers in each of which multiple elastic wave filters are connected to a common terminal and, while ensuring the low loss of one elastic wave filter, which is capable of reducing or preventing degradation of the bandpass characteristics of another elastic wave filter due to spurious waves generated by the one elastic wave filter, high-frequency front end circuits, and communication apparatuses.

According to a preferred embodiment of the present invention, a multiplexer includes a common terminal; a first elastic wave filter and a second elastic wave filter having different pass bands; and an inductance element. The first elastic wave filter includes two input-output terminals, one or more series arm resonators disposed in a path between the two input-output terminals, and two or more parallel arm resonators disposed between the path and ground. The frequency of spurious waves generated by the first elastic wave filter is included in the pass band of the second elastic wave filter. The second elastic wave filter is directly connected to the common terminal. The input-output terminal at the common terminal side, among the two input-output terminals, is connected to the common terminal with the inductance element interposed therebetween and is directly connected to one parallel arm resonator, among the two or more parallel arm resonators. The one parallel arm resonator has a largest capacitance, among the two or more parallel arm resonators.

With the above-described configuration, since the inductance element is connected in series between the first elastic wave filter and the common terminal and the resonator closest to the common terminal is the parallel arm resonator, an increase in return loss in the pass band of the second elastic wave filter when the first elastic wave filter is viewed from the common terminal is capable of being reduced or prevented. This is because the branch closer to the common terminal of the first elastic wave filter has greater influence on reflection characteristics when the first elastic wave filter is viewed from the common terminal. In the above-described configuration, the branch closest to the common terminal is the inductance element. The inductance element does not generate the spurious waves and has reflection characteristics, which are flat frequency characteristics, unlike the respective elastic wave resonators defining the first elastic wave filter. Accordingly, a decrease in a reflection factor in the pass band of the second elastic wave filter when the first elastic wave filter is viewed from the common terminal is capable of being reduced or prevented. As a result, the bandpass characteristics of the second elastic wave filter are prevented from being degraded due to the spurious waves generated by the first elastic wave filter.

In addition, since a complex conjugate relationship is established between complex impedance in a certain pass band when a single body of the first elastic wave filter is viewed from the common terminal and complex impedance in the certain pass band when a combining circuit defined by the elastic wave filters other than the first elastic wave filter is viewed from the common terminal, impedance matching in the multiplexer is improved or optimized. In order to establish the complex conjugate relationship between the complex impedance of the first elastic wave filter, beginning from the parallel arm resonator, and the capacitive complex impedance of the combining circuit, the inductance value of the inductance element, which is connected in series, is preferably high in order to make the complex impedance when a single body of the first elastic wave filter is viewed from the common terminal inductive. However, in contrast, the insertion loss in the pass band of the first elastic wave filter is capable of being decreased with the decreasing inductance value of the inductance element. From this point of view, increasing the capacitance value of the parallel arm resonator directly connected to the inductance element, among the parallel arm resonators defining the first elastic wave filter, instead of increasing the inductance value of the inductance element, effectively makes the complex impedance when a single body of the first elastic wave filter is viewed from the common terminal inductive, without increasing the inductance value of the inductance element. In contrast, in order to improve or optimize the bandpass characteristics of the first elastic wave filter, the parallel arm resonator other than the parallel arm resonator directly connected to the inductance element is set so as to have a relatively lower capacitance value.

With the above-described configuration, in the multiplexer in which the multiple elastic wave filters are connected to the common terminal, it is possible to reduce or prevent the degradation of the bandpass characteristics of the second elastic wave filter due to the spurious waves generated by the first elastic wave filter while ensuring the low loss of the first elastic wave filter.

A piezoelectric substrate including the first elastic wave filter may include a piezoelectric film including one surface on which interdigital transducer electrodes defining the one or more series arm resonators and the two or more parallel arm resonators are provided, a high acoustic velocity support substrate in which the acoustic velocity of bulk waves propagated in the high acoustic velocity support substrate is higher than the acoustic velocity of elastic waves propagated on the piezoelectric film, and a low acoustic velocity film which is disposed between the high acoustic velocity support substrate and the piezoelectric film and in which the acoustic velocity of bulk waves propagated in the low acoustic velocity film is lower than the acoustic velocity of bulk waves propagated in the piezoelectric film.

In order to achieve the impedance matching between the multiple elastic wave filters, for example, when the inductance element is connected in series at the common terminal side of the first elastic wave filter, circuit elements including an inductance element and a capacitance element are added to each elastic wave resonator. In this case, the Q factors of each elastic wave resonator may be equivalently or substantially equivalently decreased. However, even in such a case, the Q factors of each elastic wave resonator are capable of being maintained at a higher value in the laminated structure of the piezoelectric substrate. Accordingly, the elastic wave filters having the low loss in the pass bands are capable of being provided.

The pass band of the first elastic wave filter may be positioned at a low frequency side of the pass band of the second elastic wave filter, and the spurious waves generated by the first elastic wave filter may be spurious waves caused by a higher order mode.

With the above-described configuration, the bandpass characteristics of the second elastic wave filter are capable of being prevented from being degraded due to the spurious waves caused by the higher order mode, which occur at the high frequency side of the pass band of the first elastic wave filter and which are caused by the energy locked in the thickness direction of the piezoelectric film.

The pass band of the first elastic wave filter may be positioned at a high frequency side of the pass band of the second elastic wave filter, and the spurious waves generated by the first elastic wave filter may be spurious waves caused by Rayleigh waves.

With the above-described configuration, the bandpass characteristics of the second elastic wave filter are capable of being inhibited from being degraded due to the spurious waves caused by the Rayleigh waves, occurring at the low frequency side of the pass band of the first elastic wave filter.

Each of the one or more series arm resonators and the two or more parallel arm resonators may include a $LiNbO_3$ piezoelectric single crystal substrate, interdigital transducer electrodes provided on the piezoelectric single crystal substrate, and a dielectric film formed on the piezoelectric single crystal substrate and the interdigital transducer electrodes.

With the above-described configuration, the first elastic wave filter is capable of having excellent frequency temperature characteristics.

The pass band of the first elastic wave filter may be positioned at a low frequency side of the pass band of the second elastic wave filter, and the spurious waves generated by the first elastic wave filter may be spurious waves caused by a higher order mode.

With the above-described configuration, the bandpass characteristics of the second elastic wave filter are capable of being inhibited from being degraded due to the spurious waves caused by the higher order mode, which occur at the high frequency side of the pass band of the first elastic wave filter and which are caused by the energy locked into the dielectric film.

The second elastic wave filter may include one or more series arm resonators disposed on a path between the two input-output terminals and one or more parallel arm resonators disposed between the path and the ground. The common terminal may be directly connected to only one series arm resonator, among the one or more series arm resonators and the one or more parallel arm resonators.

With the above-described configuration, the complex impedance in the certain pass band is made capacitive when the second elastic wave filter is viewed from the common terminal. Accordingly, the high accuracy complex conjugate relationship is capable of being established between the inductive complex impedance when the first elastic wave filter is viewed from the common terminal and the capacitive complex impedance when the second elastic wave filter is viewed from the common terminal.

The multiplexer may include a first duplexer including two filters including the first elastic wave filter and a second duplexer including two filters including the second elastic wave filter.

With the above-described configuration, in the multiplexer including the multiple duplexers, it is possible to reduce or prevent the degradation of the bandpass characteristics of the second elastic wave filter due to the spurious waves generated by the first elastic wave filter while ensuring the low loss of the first elastic wave filter.

The pass band of the first elastic wave filter may be a Band66 upstream frequency band (transmission frequency band) in Long Term Evolution (LTE), and the pass band of the second elastic wave filter may be a Band30 upstream frequency band in the LTE.

When the pass band of the first elastic wave filter is the Band66 upstream frequency band in the LTE and the pass band of the second elastic wave filter is the Band30 upstream frequency band in the LTE, the frequency of the spurious waves caused by the higher order mode in the first elastic wave filter is positioned within the pass band of the second elastic wave filter. With the above-described configuration, the increase in the return loss in the pass band of the second elastic wave filter when the first elastic wave filter is viewed from the common terminal is capable of begin reduced or prevented. Accordingly, it is possible to reduce or prevent the degradation of the bandpass characteristics of the second elastic wave filter due to the spurious waves caused by the higher order mode, generated by the first elastic wave filter.

According to a preferred embodiment of the present invention, a high-frequency front end circuit includes any of the multiplexers according to preferred embodiments of the present invention described above and an amplifier circuit connected to the multiplexer.

With the above-described configuration, it is possible to provide the high-frequency front end circuit capable of reducing or preventing the degradation of the bandpass characteristics of the second elastic wave filter due to the spurious waves generated by the first elastic wave filter while ensuring the low loss of the first elastic wave filter.

According to a preferred embodiment of the present invention, a communication apparatus includes a radio-frequency signal processing circuit that processes a high-frequency signal transmitted and received with an antenna element and the high-frequency front end circuit, which transmits the high-frequency signal between the antenna element and the radio-frequency signal processing circuit.

With the above-described configuration, it is possible to provide the communication apparatus capable of reducing or preventing the degradation of the bandpass characteristics of the second elastic wave filter due to the spurious waves generated by the first elastic wave filter while ensuring the low loss of the first elastic wave filter.

With multiplexers, high-frequency front end circuits, and communication apparatuses according to preferred embodiments of the present invention, it is possible to reduce or prevent the degradation of the bandpass characteristics of one elastic wave filter due to the spurious waves generated by another elastic wave filter while ensuring the low loss of said another elastic wave filter.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
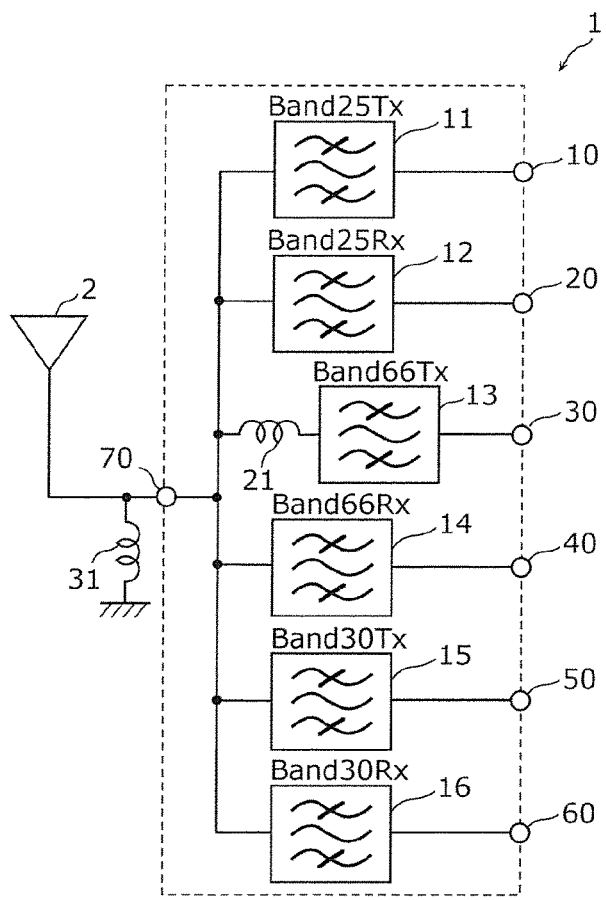
FIG. 1 is a circuit configuration diagram of a multiplexer according to a first preferred embodiment of the present invention.

Preferred embodiments of the present invention will be described in detail with reference to the drawings. The preferred embodiments described below indicate comprehensive or specific examples. Numerical values, shapes, materials, components, the positions where the components are disposed, the connection mode of the components, and other aspects, which are indicated in the preferred embodiments described below, are only examples and are not intended to limit the present invention. Among the components in the preferred embodiments described below, the components that are not described in the independent claims are described as optional components. In addition, the sizes or the ratios of the sizes of the components illustrated in the drawings are not necessarily strictly indicated.

First Preferred Embodiment

A hexaplexer will be exemplified in a first preferred embodiment of the present invention, which is preferably applied to Band25 (transmission pass band: about 1,850 MHz to about 1,915 MHz and reception pass band: about 1,930 MHz to about 1,995 MHz), Band66 (transmission pass band; about 1,710 MHz to about 1,780 MHz and reception pass band: about 2,010 MHz to about 2,200 MHz), and Band30 (transmission pass band: about 2,305 MHz to about 2,315 MHz and reception pass band; about 2,350 MHz to about 2,360 MHz) in Long Term Evolution (LTE).

A multiplexer 1 according to the first preferred embodiment is preferably a hexaplexer in which, for example, a Band25 duplexer, a Band66 duplexer, and a Band30 duplexer are connected to each other with a common terminal 70.

FIG. 1 is a circuit configuration diagram of the multiplexer 1 according to the first preferred embodiment. Referring to FIG. 1, the multiplexer 1 includes transmission-side filters 11, 13, and 15, reception-side filters 12, 14, and 16, an inductance element 21, the common terminal 70, transmission input terminals 10, 30, and 50, and reception output terminals 20, 40, and 60. The transmission-side filters 11, 13, and 15 and the reception-side filters 12, 14, and 16 are surface acoustic wave filters. The multiplexer 1 is connected to an antenna element 2 with the common terminal 70. An inductance element 31 is connected between a connection path between the common terminal 70 and the antenna element 2 and ground, which is a reference terminal. The inductance element 31 may be connected in series between the common terminal 70 and the antenna element 2. The multiplexer 1 may have a configuration in which the inductance element 31 is not included. The inductance element 31 may be included in the multiplexer 1 or may be provided outside the multiplexer 1.

The transmission-side filter 11 is a band pass filter that receives transmission waves generated by a transmission circuit (for example, a radio frequency integrated circuit (RFIC)) through the transmission input terminal 10, performs filtering of the transmission waves in the Band25 transmission pass band, and supplies the transmission waves subjected to the filtering to the common terminal 70.

The reception-side filter 12 receives reception waves through the common terminal 70, performs filtering of the reception waves in the Band25 reception pass band, and supplies the reception waves subjected to the filtering to the reception output terminal 20.

The transmission-side filter 13 is a first elastic wave filter that receives the transmission waves generated by the transmission circuit (for example, an RFIC) through the transmission input terminal 30, performs filtering of the transmission waves in the Band66 transmission pass band, and supplies the transmission waves subjected to the filtering to the common terminal 70. The transmission-side filter 13 includes two input-output terminals, one or more series arm resonators disposed on a path between the two input-output terminals, and two or more parallel arm resonators disposed between the path and the ground.

The inductance element 21 is connected in series between the transmission-side filter 13 and the common terminal 70. The connection of the inductance element 21 at the common terminal 70 side of the transmission-side filter 13 enables complex impedance of the transmission-side filter 13 to be made inductive.

The frequency of spurious waves caused by a higher order mode, generated by the transmission-side filter 13 (the first elastic wave filter), is positioned within the pass band of the transmission-side filter 15 (a second elastic wave filter). However, in the multiplexer 1 according to the first preferred embodiment, since the inductance element 21 is connected in series between the common terminal 70 and the transmission-side filter 13, an influence of the spurious waves generated by the transmission-side filter 13 on the transmission-side filter 15 is capable of being reduced or prevented. In other words, the inductance element 21 makes the complex impedance of the transmission-side filter 13 inductive and reduces or prevents the influence of the spurious waves generated by the transmission-side filter 13 on bandpass characteristics of the transmission-side filter 15.

The reception-side filter 14 receives the reception waves through the common terminal 70, performs filtering of the reception waves in the Band66 reception pass band, and supplies the reception waves subjected to the filtering to the reception output terminal 40.

The transmission-side filter 15 is a second elastic wave filter that receives the transmission waves generated by the transmission circuit (for example, an RFIC) through the transmission input terminal 50, performs filtering of the transmission waves in the Band30 transmission pass band, and supplies the transmission waves subjected to the filtering to the common terminal 70.

The reception-side filter 16 receives the reception waves through the common terminal 70, performs filtering of the reception waves in the Band30 reception pass band, and supplies the reception waves subjected to the filtering to the reception output terminal 60.

Each of the transmission-side filters 11 and 15 and the reception-side filters 12, 14, and 16 includes two input-output terminals, at least one series arm resonator disposed on a path between the two input-output terminals, and at least one parallel arm resonator disposed between the path and the ground.

In the first preferred embodiment, the series arm resonators and the parallel arm resonators defining the transmission-side filters 11, 13, and 15 and the reception-side filters 12, 14, and 16 are preferably surface acoustic wave resonators, for example.

The transmission-side filters 11 and 15 and the reception-side filters 12, 14, and 16 are directly connected to the common terminal 70 with no element interposed therebetween. The transmission-side filter 13 is connected to the common terminal 70 with the inductance element 21 interposed therebetween.

Although the filter to which the inductance element 21 is connected in series is the transmission-side filter 13 in the multiplexer 1 according to the first preferred embodiment, the filter to which the inductance element 21 is connected in series is not limited to the transmission-side filter 13. It is sufficient for one filter to which the inductance element 21 is connected in series to have a relationship in which the frequency of the spurious waves generated by the one filter is included in the pass band of at least any other filter connected to the common terminal 70.

The structures of the elastic wave resonators defining the transmission-side filters 11, 13, and 15 and the reception-side filters 12, 14, and 16 will now be described.

Figure 2A:
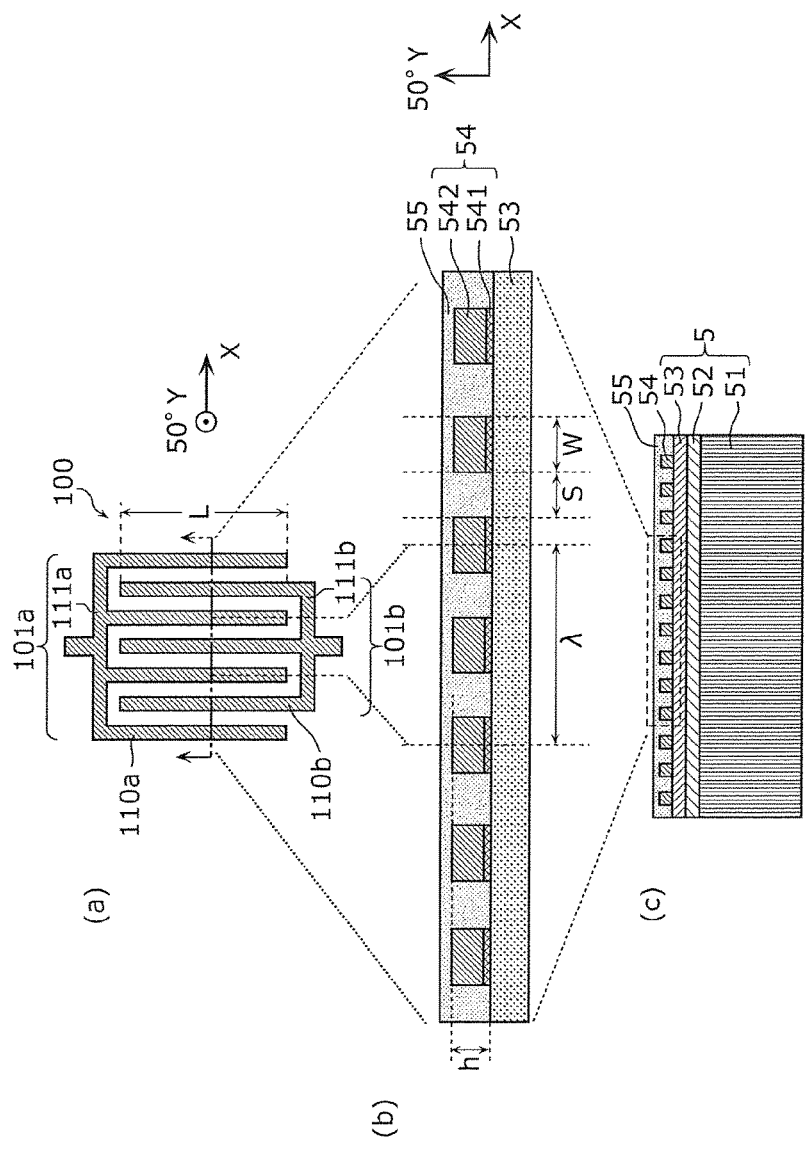
FIG. 2A includes a plan schematic view and cross-sectional schematic views illustrating an example of a resonator according to the first preferred embodiment of the present invention.

FIG. 2A is an outline drawing schematically illustrating an example of the elastic wave resonator according to the first preferred embodiment. In FIG. 2A, (a) is a plan view and (b) and (c) are cross-sectional views along an alternate long and short dash line illustrated in (a). A plan schematic view and cross-sectional schematic views representing the structure of a resonator 100 defining a series arm resonator 101 in the transmission-side filter 11, among the multiple series arm resonators and parallel arm resonators defining the transmission-side filters 11, 13, and 15 and the reception-side filters 12, 14, and 16, are illustrated in FIG. 2A. The resonator 100 illustrated in FIG. 2A is exemplified to describe the typical structure of the multiple resonators, and the number of electrode fingers included in each electrode, the lengths of the electrode fingers, and other parameters are not limited to the ones illustrated in FIG. 2A.

The resonator 100 includes a piezoelectric substrate 5 and interdigital electrodes 101a and 101b.

As illustrated in (a) in FIG. 2A, a pair of the interdigital electrodes 101a and 101b, which are opposed to each other, is provided on the piezoelectric substrate 5. The interdigital electrode 101a includes a plurality of electrode fingers 110a, which are parallel or substantially parallel to each other, and a busbar electrode 111a with which the electrode fingers 110a are connected. The interdigital electrode 101b includes a plurality of electrode fingers 110b, which are parallel or substantially parallel to each other, and a busbar electrode 111b with which the electrode fingers 110b are connected. The plurality of electrode fingers 110a and the plurality of electrode fingers 110b extend along a direction orthogonal or substantially orthogonal to the X-axis direction.

Interdigital transducer (IDT) electrodes 54 of the plurality of electrode fingers 110a, the plurality of electrode fingers 110b, the busbar electrode 111a, and the busbar electrode 111b have a laminated structure including a close contact layer 541 and a main electrode layer 542, as illustrated in (b) in FIG. 2A.

The close contact layer 541 improves the contact between the piezoelectric substrate 5 and the main electrode layer 542 and is preferably made of, for example, Ti. The film thickness of the close contact layer 541 is preferably, for example, about 12 nm.

The main electrode layer 542 is preferably made of, for example, Al including about 1% of Cu. The film thickness of the main electrode layer 542 is preferably, for example, about 162 nm.

A protective layer 55 covers the interdigital electrode 101a and the interdigital electrode 101b. The protective layer 55 provided to protect the main electrode layer 542 from the external environment, adjust frequency temperature characteristics, improve moisture resistance, and so on. The protective layer 55 is preferably, for example, a dielectric film including silicon dioxide as the main component. The thickness of the protective layer 55 is preferably, for example, about 25 nm.

The materials of the close contact layer 541, the main electrode layer 542, and the protective layer 55 are not limited to the ones described above. The IDT electrodes 54 may not have the above laminated structure. The IDT electrodes 54 may be made of, for example, a metal such as Ti, Al, Cu, Pt, Au, Ag, or Pd, or an alloy thereof. The IDT electrodes 54 may include multiple multilayer bodies made of the above metal or alloy. The protective layer 55 may not be provided.

The laminated structure of the piezoelectric substrate 5 will now be described.

As illustrated in (c) in FIG. 2A, the piezoelectric substrate 5 includes a high acoustic velocity support substrate 51, a low acoustic velocity film 52, and a piezoelectric film 53. The piezoelectric substrate 5 has a structure in which the high acoustic velocity support substrate 51, the low acoustic velocity film 52, and the piezoelectric film 53 are laminated in this order.

The piezoelectric film 53 is preferably made of, for example, 50° rotated Y cut X propagation $LiTaO_3$ piezoelectric single crystal or piezoelectric ceramics (lithium tantalite single crystal cut along a plane the normal line of which is the axis resulting from rotation from the Y axis around the X axis by about 50' or ceramics, on which the surface acoustic waves are propagated in the X-axis direction). The piezoelectric film 53 preferably has a thickness of, for example, about 600 nm. The material and the Cut-Angles of the piezoelectric single crystal used as the piezoelectric film 53 are appropriately selected depending on the specifications required for each filter.

The high acoustic velocity support substrate 51 supports the low acoustic velocity film 52, the piezoelectric film 53, and the IDT electrodes 54. The high acoustic velocity support substrate 51 is a substrate in which the acoustic velocity of bulk waves in the high acoustic velocity support substrate 51 is higher than the acoustic velocity of elastic waves, such as surface acoustic waves or boundary waves, propagated on the piezoelectric film 53. The high acoustic velocity support substrate 51 locks the surface acoustic waves into a portion in which the piezoelectric film 53 and the low acoustic velocity film 52 are laminated to prevent the surface acoustic waves from leaking below the high acoustic velocity support substrate 51. The high acoustic velocity support substrate 51 is preferably, for example, a silicon substrate and has a thickness of, for example, about 200 μm.

In the low acoustic velocity film 52, the acoustic velocity of the bulk waves in the low acoustic velocity film 52 is lower than the acoustic velocity of the bulk waves propagated in the piezoelectric film 53 and is disposed between the piezoelectric film 53 and the high acoustic velocity support substrate 51. Due to this structure and the property in which the energy of the elastic waves is inherently concentrated on a medium that has a low acoustic velocity, leakage of the energy of the surface acoustic waves from the IDT electrodes is reduced or prevented. The low acoustic velocity film 52 is preferably, for example, a film including silicon dioxide as the main component and has a thickness of, for example, about 670 nm.

With the above-described laminated structure of the piezoelectric substrate 5, the Q factors in the resonant frequency and the anti-resonant frequency are capable of being greatly increased, as compared to a structure in the related art in which the piezoelectric substrate includes one layer. In other words, since the elastic wave resonators having high Q factors are capable of being produced, the filters having low insertion loss are capable of being provided using the elastic wave resonators.

In addition, in order to achieve impedance matching between the multiple filters, for example, when the inductance element 21 is connected in series at the common terminal 70 side of the transmission-side filter 13, circuit elements including an inductance element and a capacitance element are included. As a result, the Q factors of the resonator 100 may be equivalently or substantially equivalently decreased. However, even in such a case, the Q factors of the resonator 100 are capable of being maintained at a higher value in the above-described laminated structure of the piezoelectric substrate 5.

The high acoustic velocity support substrate 51 may preferably have a structure in which a support substrate and a high acoustic velocity film are laminated. In the high acoustic velocity film, the acoustic velocity of the bulk waves propagated in the high acoustic velocity film is higher than the acoustic velocity of the elastic waves, such as the surface acoustic waves or the boundary waves, propagated on the piezoelectric film 53. In this case, sapphire; a piezoelectric material, such as lithium tantalite, lithium niobate, or crystal; ceramics, such as alumina, magnesia, silicon nitride, aluminum nitride, silicon carbide, zirconia, cordierite, mullite, steatite, or forsterite; a dielectric material, such as a glass; or a semiconductor, such as silicon or gallium nitride, and a resin substrate may be used for the support substrate. Various high acoustic velocity materials, such as aluminum nitride, aluminum oxide, silicon carbide, silicon nitride, silicon oxynitride, a diamond-like carbon (DLC) film, diamond, a medium including any of the above-described materials as the main component, or a medium including any mixture of the above-described materials as the main component, may preferably be used for the high acoustic velocity film.

Figure 2B:
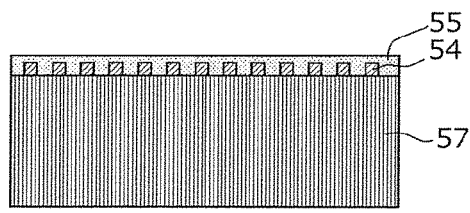
FIG. 2B is a cross-sectional view schematically illustrating a resonator according to a modification of the first preferred embodiment of the present invention.

FIG. 2B is a cross-sectional view schematically illustrating the resonator 100 according to a modification of the first preferred embodiment. Although the IDT electrodes 54 of the resonator 100 are provided on the piezoelectric substrate 5 including the piezoelectric film 53 in the resonator 100 illustrated in FIG. 2A, the substrate on which the IDT electrodes 54 are provided may be a piezoelectric single crystal substrate 57 made of a single piezoelectric layer, as illustrated in FIG. 2B. The piezoelectric single crystal substrate 57 is preferably made of, for example, $LiNbO_3$ piezoelectric single crystal. The resonator 100 according to this modification includes the $LiNbO_3$ piezoelectric single crystal substrate 57, the IDT electrodes 54, and the protective layer 55 provided on the piezoelectric single crystal substrate 57 and the IDT electrodes 54.

The laminated structure, the materials, the Cut-Angles, and the thicknesses of the piezoelectric film 53 and the piezoelectric single crystal substrate 57 described above may be appropriately varied depending on, for example, the bandpass characteristics required for the elastic wave filter apparatus. The resonator 100 including, for example, a $LiTaO_3$ piezoelectric substrate having Cut-Angles other than the Cut-Angles described above is capable of achieving similar effects and advantages as those of the resonator 100 including the piezoelectric film 53 described above.

An example of electrode parameters of the IDT electrodes of the elastic wave resonator will now be described.

The wavelength of the elastic wave resonator is defined by a wavelength λ, which is a repetition period of the multiple electrode fingers 110a or 110b of the IDT electrodes 54 illustrated in (b) in FIG. 2A. The electrode pitch is half of the wavelength λ and is defined as (W+S) where W denotes the line width of the electrode fingers 110a of the interdigital electrode 101a and the electrode fingers 110b included in the interdigital electrode 101b and S denotes the space width between the electrode finger 110a and the electrode finger 110b that are adjacent to each other. An opposing length L of the pair of the interdigital electrode 101a and the interdigital electrode 101b is the electrode finger length of the electrode fingers 110a and the electrode fingers 110b that are overlapped with each other when viewed along the X-axis direction, as illustrated in (a) in FIG. 2A. The electrode duty of each resonator is the occupancy of the multiple electrode fingers 110a and 110b in the line width and is the ratio of the line width to the value of addition of the line width of the multiple electrode fingers 110a and 110b to the space width thereof. The electrode duty is defined as W/(W+S). The height of the interdigital electrode 101a and the interdigital electrode 101b is denoted by h. The parameters, such as the wavelength λ, the opposing length L, the electrode duty, and the height h of the IDT electrodes 54, which determine the shape and the size of the resonator 100, are resonator parameters.

Exemplary circuit configurations of the respective elastic wave filters will now be described with reference to FIG. 3A to FIG. 6.

Figure 3A:
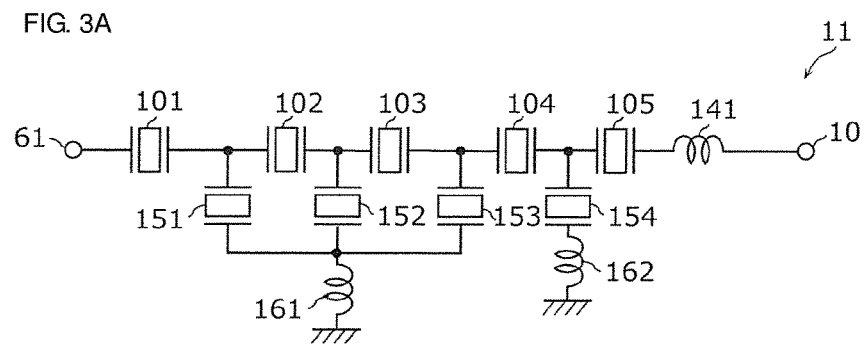
FIG. 3A is a circuit configuration diagram of a Band25 transmission-side filter included in the multiplexer according to the first preferred embodiment of the present invention.

FIG. 3A is a circuit configuration diagram of the Band25 transmission-side filter 11 of the multiplexer 1 according to the first preferred embodiment. Referring to FIG. 3A, the transmission-side filter 11 includes series arm resonators 101, 102, 103, 104, and 105, parallel arm resonators 151, 152, 153, and 154, and inductance elements 141, 161, and 162.

The series arm resonators 101, 102, 103, 104, and 105 are disposed on a path connecting the transmission input terminal 10 to a transmission output terminal 61 and are connected in series to each other. The parallel arm resonators 151, 152, 153, and 154 are disposed between the path and the reference terminal (the ground) and are connected so as to be parallel to each other. Because of the above-described connection configuration of the series arm resonators 101, 102, 103, 104, and 105 and the parallel arm resonators 151, 152, 153, and 154, the transmission-side filter 11 defines a ladder band pass filter. The inductance element 141 is connected in series between the transmission input terminal 10 and the series arm resonator 105. The inductance element 141 may be connected between a path connecting the transmission input terminal 10 to the series arm resonator 105 and the reference terminal. The inductance element 141 enables isolation of the transmission-side filter 11 to be increased using the coupling between the inductance element 141 and the other inductance elements 161 and 162. The inductance element 161 is connected between a node between the parallel arm resonators 151, 152, and 153 and the reference terminal. The inductance element 162 is connected between the parallel arm resonator 154 and the reference terminal.

The transmission output terminal 61 is connected to the common terminal 70 (refer to FIG. 1). The transmission output terminal 61 is connected to the series arm resonator 101 and is directly connected to none of the parallel arm resonators 151, 152, 153, and 154.

Figure 3B:
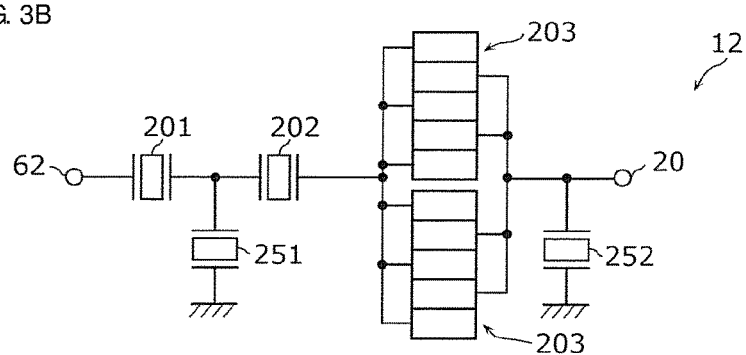
FIG. 3B is a circuit configuration diagram of a Band25 reception-side filter included in the multiplexer according to the first preferred embodiment of the present invention.

FIG. 3B is a circuit configuration diagram of the Band25 reception-side filter 12 of the multiplexer 1 according to the first preferred embodiment. Referring to FIG. 3B, the reception-side filter 12 includes, for example, a longitudinally coupled surface acoustic wave filter portion. More specifically, the reception-side filter 12 includes a longitudinally coupled filter portion 203, series arm resonators 201 and 202, and parallel arm resonators 251 and 252.

Figure 6:
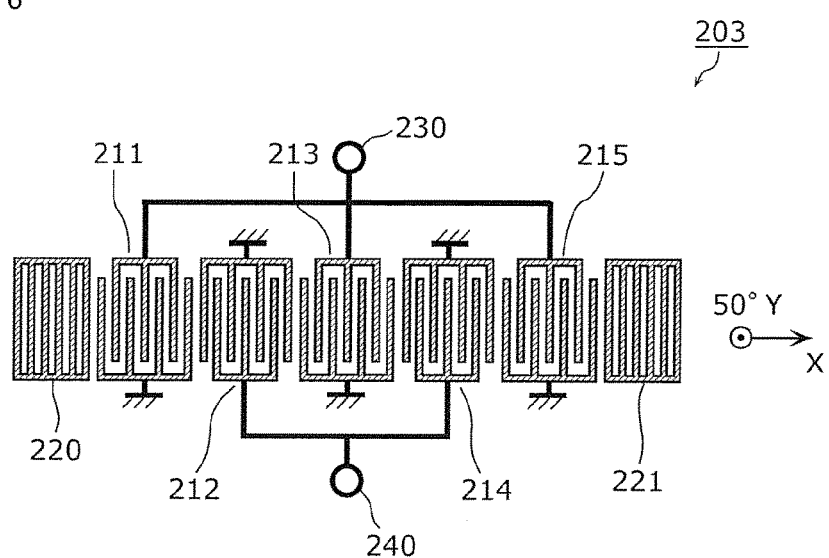
FIG. 6 is a schematic plan view illustrating an electrode configuration of a longitudinally coupled surface acoustic wave filter according to the first preferred embodiment of the present invention.

FIG. 6 is a schematic plan view illustrating an electrode configuration of the longitudinally coupled filter portion 203 according to the first preferred embodiment. Referring to FIG. 6, the longitudinally coupled filter portion 203 includes IDTs 211, 212, 213, 214, and 215, reflectors 220 and 221, an input port 230, and an output port 240.

Each of the IDTs 211, 212, 213, 214, and 215 includes a pair of IDT electrodes that are opposed to each other. The IDTs 212 and 214 sandwich the IDT 213 in the X-axis direction, and the IDTs 211 and 215 sandwich the IDTs 212 to 214 in the X-axis direction. The reflectors 220 and 221 sandwich the IDTs 211, 212, 213, 214, and 215 in the X-axis direction. The IDTs 211, 213, and 215 are connected in parallel between the input port 230 and the reference terminal, and the IDTs 212 and 214 are connected in parallel between the output port 240 and the reference terminal.

As illustrated in FIG. 3B, the series arm resonators 201 and 202 and the parallel arm resonators 251 and 252 define a ladder filter portion.

A reception input terminal 62 is connected to the common terminal 70 (refer to FIG. 1). As illustrated in FIG. 3B, the reception input terminal 62 is connected to the series arm resonator 201 and is directly connected to none of the parallel arm resonators 251 and 252.

Figure 4A:
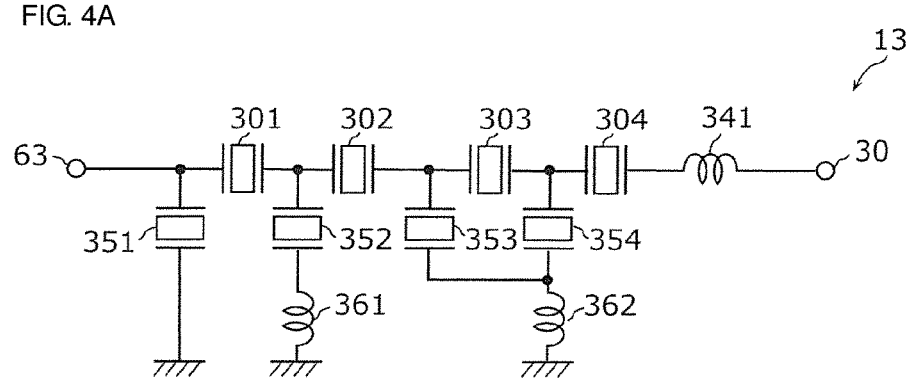
FIG. 4A is a circuit configuration diagram of a Band66 transmission-side filter included in the multiplexer according to the first preferred embodiment of the present invention.

FIG. 4A is a circuit configuration diagram of the Band66 transmission-side filter 13 of the multiplexer 1 according to the first preferred embodiment. Referring to FIG. 4A, the transmission-side filter 13 includes series arm resonators 301, 302, 303, and 304, parallel arm resonators 351, 352, 353, and 354, and inductance elements 341, 361, and 362.

The series arm resonators 301, 302, 303, and 304 are disposed on a path connecting the transmission input terminal 30 to a transmission output terminal 63 and are connected in series to each other. The parallel arm resonators 351, 352, 353, and 354 are disposed between the path and the reference terminal (the ground) and are connected so as to be parallel to each other. Because of the above-described connection configuration of the series arm resonators 301, 302, 303, and 304 and the parallel arm resonators 351, 352, 353, and 354, the transmission-side filter 13 defines a ladder band pass filter. The inductance element 341 is connected in series between the transmission input terminal 30 and the series arm resonator 304. The inductance element 341 may be connected between a path connecting the transmission input terminal 30 to the series arm resonator 304 and the reference terminal. The inductance element 341 enables isolation of the transmission-side filter 13 to be increased using the coupling between the inductance element 341 and the other inductance elements 361 and 362. The inductance element 361 is connected between the parallel arm resonator 352 and the reference terminal. The inductance element 362 is connected between a node between the parallel arm resonators 353 and 354 and the reference terminal.

Specifically, in the transmission-side filter 13, the transmission output terminal 63, which is the input-output terminal at the common terminal 70 side, among the two input-output terminals, is connected to the common terminal 70 (refer to FIG. 1) with the inductance element 21 interposed therebetween. The transmission output terminal 63 is connected to the parallel arm resonator 351, among the parallel arm resonators 351, 352, 353, and 354. In other words, the transmission output terminal 63 is connected to the parallel arm resonator 351 with none of the series arm resonators 301, 302, 303, and 304 interposed therebetween. The parallel arm resonator 351 has the largest capacitance, among the parallel arm resonators 351, 352, 353, and 354.

Figure 4B:
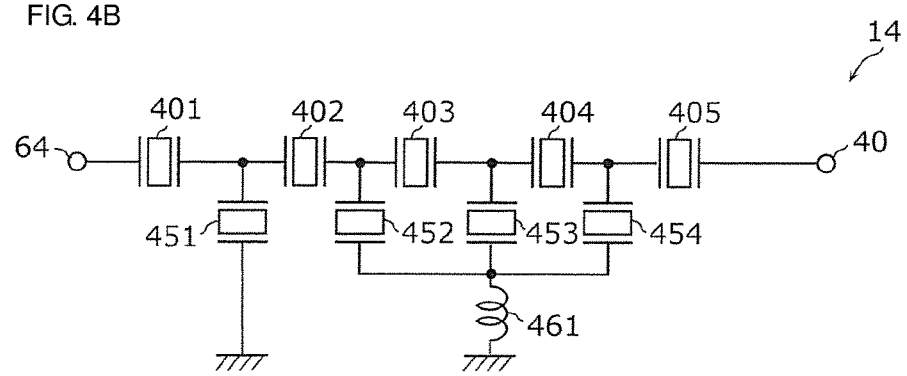
FIG. 4B is a circuit configuration diagram of a Band66 reception-side filter included in the multiplexer according to the first preferred embodiment of the present invention.

FIG. 4B is a circuit configuration diagram of the Band66 reception-side filter 14 of the multiplexer 1 according to the first preferred embodiment. Referring to FIG. 4B, the reception-side filter 14 includes series arm resonators 401, 402, 403, 404, and 405, parallel arm resonators 451, 452, 453, and 454, and an inductance element 461.

The series arm resonators 401, 402, 403, 404, and 405 are disposed on a path connecting the reception output terminal 40 and a reception input terminal 64 and are connected in series to each other. The parallel arm resonators 451, 452, 453, and 454 are disposed between the path and the reference terminal (the ground) and are connected in parallel to each other. Because of the above connection configuration of the series arm resonators 401, 402, 403, 404, and 405 and the parallel arm resonators 451, 452, 453, and 454, the reception-side filter 14 defines a ladder band pass filter. The inductance element 461 is connected between a node between the parallel arm resonators 452, 453, and 454 and the reference terminal.

The reception input terminal 64 is connected to the common terminal 70 (refer to FIG. 1). As illustrated in FIG. 4B, the reception input terminal 64 is connected to the series arm resonator 401 and is directly connected to none of the parallel arm resonators 451, 452, 453, and 454.

Figure 5A:
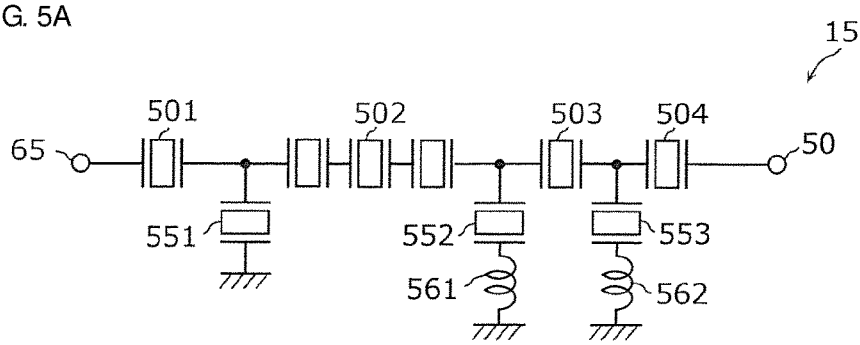
FIG. 5A is a circuit configuration diagram of a Band30 transmission-side filter included in the multiplexer according to the first preferred embodiment of the present invention.

FIG. 5A is a circuit configuration diagram of the Band30 transmission-side filter 15 of the multiplexer 1 according to the first preferred embodiment. Referring to FIG. 5A, the transmission-side filter 15 includes series arm resonators 501, 502, 503, and 504, parallel arm resonators 551, 552, and 553, and inductance elements 561 and 562.

The series arm resonators 501, 502, 503, and 504 are disposed on a path connecting the transmission input terminal 50 to a transmission output terminal 65 and are connected in series to each other. The parallel arm resonators 551, 552, and 553 are disposed between the path and the reference terminal (the ground) and are connected so as to be parallel to each other. The series arm resonator 502 includes three divided resonators that are connected in series to each other. Because of the above-described connection configuration of the series arm resonators 501, 502, 503, and 504 and the parallel arm resonators 551, 552, and 553, the transmission-side filter 15 defines a ladder band pass filter. The inductance element 561 is connected between the parallel arm resonator 552 and the reference terminal. The inductance element 562 is connected between the parallel arm resonator 553 and the reference terminal.

The transmission output terminal 65 is connected to the common terminal 70 (refer to FIG. 1). The transmission output terminal 65 is connected to the series arm resonator 501 and is directly connected to none of the parallel arm resonators 551, 552, and 553.

Figure 5B:
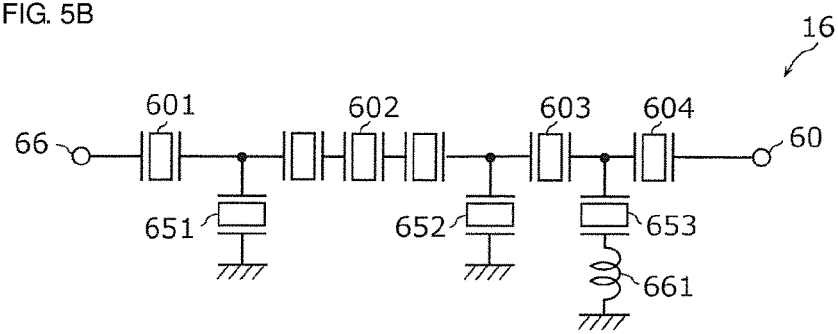
FIG. 5B is a circuit configuration diagram of a Band30 reception-side filter included in the multiplexer according to the first preferred embodiment of the present invention.

FIG. 5B is a circuit configuration diagram of the Band30 reception-side filter 16 of the multiplexer 1 according to the first preferred embodiment. Referring to FIG. 5B, the reception-side filter 16 includes series arm resonators 601, 602, 603, and 604, parallel arm resonators 651, 652, and 653, and an inductance element 661.

The series arm resonators 601, 602, 603, and 604 are disposed on a path connecting the reception output terminal 60 to a reception input terminal 66 and are connected in series to each other. The parallel arm resonators 651, 652, and 653 are disposed between the path and the reference terminal (the ground) and are connected in parallel to each other. The series arm resonator 602 includes three divided resonators that are connected in series to each other. Because of the above-described connection configuration of the series arm resonators 601, 602, 603, and 604 and the parallel arm resonators 651, 652, and 653, the reception-side filter 16 defines a ladder band pass filter. The inductance element 661 is connected between the parallel arm resonator 653 and the reference terminal.

The reception input terminal 66 is connected to the common terminal 70 (refer to FIG. 1). As illustrated in FIG. 5B, the reception input terminal 66 is connected to the series arm resonator 601 and is directly connected to none of the parallel arm resonators 651, 652, and 653.

The arrangement configuration of the resonators and the circuit elements in each elastic wave filter in the multiplexer 1 according to the first preferred embodiment is not limited to the arrangement configuration exemplified for the transmission-side filters 11, 13, and 15 and the reception-side filters 12, 14, and 16 described above. The arrangement configuration of the resonators and the circuit elements in each elastic wave filter may be varied depending on the specifications required for the bandpass characteristics in each frequency band (Band). The arrangement configuration means, for example, the number of the series arm resonators and the parallel arm resonators that are disposed and selection of the filter configuration, such as the ladder filter or the longitudinally coupled filter.

The operating principle of the ladder elastic wave filter according to the first preferred embodiment will now be described.

For example, each of the parallel arm resonators 151, 152, 153, and 154 illustrated in FIG. 3A has a resonant frequency frp and an anti-resonant frequency fap (>frp) in resonance characteristics. Each of the series arm resonators 101, 102, 103, 104, and 105 has a resonant frequency frs and an anti-resonant frequency fas (>frs>frp) in the resonance characteristics. Although the resonant frequencies frs of the series arm resonators 101, 102, 103, 104, and 105 are designed so as to be equal or substantially equal to each other, the resonant frequencies frs of the series arm resonators 101, 102, 103, 104, and 105 are not necessarily equal or substantially equal to each other. The same applies to the anti-resonant frequencies fas of the series arm resonators 101, 102, 103, 104, and 105, the resonant frequencies frp of the parallel arm resonators 151, 152, 153, and 154, and the anti-resonant frequencies fap of the parallel arm resonators 151, 152, 153, and 154.

In the configuration of the band pass filter including the ladder resonators, the anti-resonant frequencies fap of the parallel arm resonators 151, 152, 153, and 154 are close to the resonant frequencies frs of the series arm resonators 101, 102, 103, 104, and 105. This causes lower stop bands near the resonant frequencies frp in which the impedances of the parallel arm resonators 151, 152, 153, and 154 are close to zero. When the frequencies are further increased, the impedances of the parallel arm resonators 151, 152, 153, and 154 are increased near the anti-resonant frequencies fap and the impedances of the series arm resonators 101, 102, 103, 104, and 105 are close to zero near the resonant frequencies frs. Accordingly, signal pass bands appear on the signal path from the transmission input terminal 10 to the transmission output terminal 61 near the anti-resonant frequencies fap to the resonant frequencies frs. When the frequencies are further increased to be close to the anti-resonant frequencies fas, the impedances of the series arm resonators 101, 102, 103, 104, and 105 are increased to cause higher stop bands. In other words, the sharpness of attenuation characteristics in the higher stop bands is greatly affected by where the anti-resonant frequencies fas of the series arm resonators 101, 102, 103, 104, and 105 are set outside the signal pass bands.

Upon input of a high-frequency signal into the transmission-side filter 11 through the transmission input terminal 10, a potential difference occurs between the transmission input terminal 10 and the reference terminal. This causes the piezoelectric substrate 5 to be strained to generate the surface acoustic waves propagated in the X-axis direction. Here, making the wavelength X of the interdigital electrode 101a and the interdigital electrode 101b equal or substantially equal to the wavelength of the pass band causes only the high-frequency signal having the frequency component to be transmitted to be transmitted through the transmission-side filter 11.

Characteristic configurations and advantages of the multiplexer 1 according to the first preferred embodiment will now be described while comparing the multiplexer 1 with a multiplexer 500 according to a comparative example.

Figure 7:
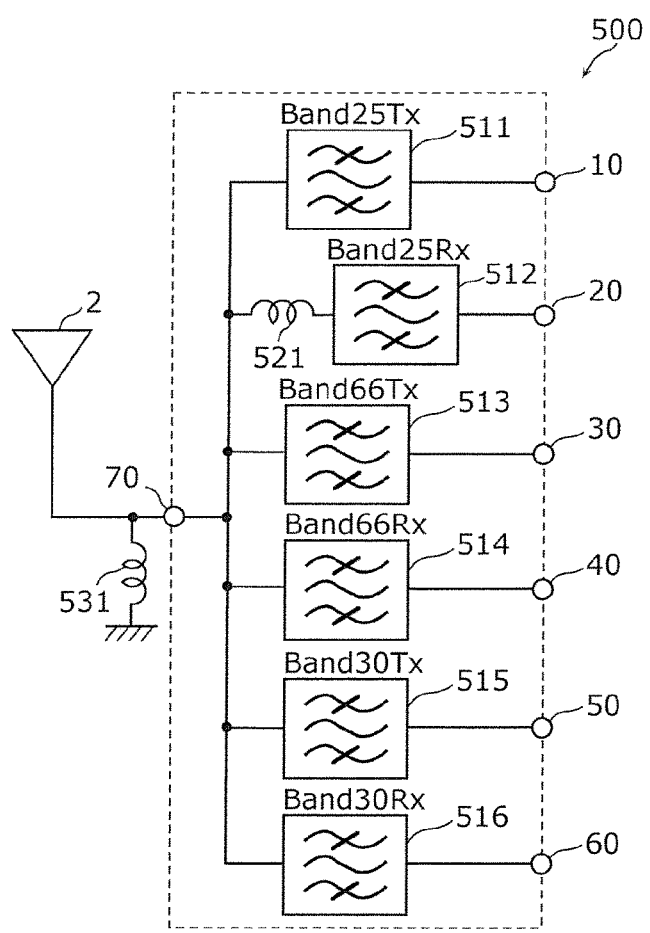
FIG. 7 is a circuit configuration diagram of a multiplexer according to a comparative example of the present invention.

FIG. 7 is a circuit configuration diagram of the multiplexer 500 according to the comparative example. Referring to FIG. 7, the multiplexer 500 includes transmission-side filters 511, 513, and 515, reception-side filters 512, 514, and 516, an inductance element 521, the common terminal 70, the transmission input terminals 10, 30, and 50, and the reception output terminals 20, 40, and 60. The multiplexer 500 illustrated in FIG. 7 differs from the multiplexer 1 according to the first preferred embodiment in the circuit configurations of the Band25 reception-side filter 512 and the Band66 transmission-side filter 513, among the six filters of the multiplexer. A description of the same components in the multiplexer 500 according to the comparative example as those in the multiplexer 1 according to the first preferred embodiment is omitted herein and different components will be primarily described.

The inductance element 521 is connected in series between the reception-side filter 512 and the common terminal 70. The connection of the inductance element 521 at the common terminal 70 side of the reception-side filter 512 enables the complex impedance of the reception-side filter 512 to be made inductive.

The transmission-side filter 513 is connected to the common terminal 70 with no inductance element interposed therebetween.

The transmission-side filter 511 in the multiplexer 500 has the same or substantially the same configuration as that of the transmission-side filter 11 in the multiplexer 1. The reception-side filter 514 in the multiplexer 500 has the same or substantially the same configuration as that of the reception-side filter 14 in the multiplexer 1. The transmission-side filter 515 in the multiplexer 500 has the same or substantially the same configuration as that of the transmission-side filter 15 in the multiplexer 1. The reception-side filter 516 in the multiplexer 500 has the same or substantially the same configuration as that of the reception-side filter 16 in the multiplexer 1.

Figure 8A:
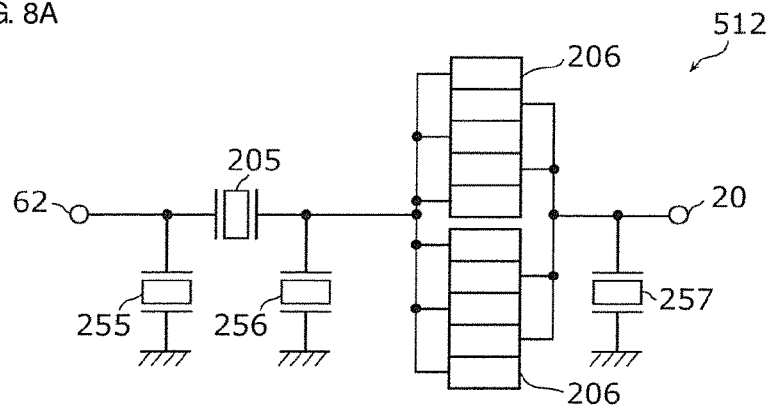
FIG. 8A is a circuit configuration diagram of a Band25 reception-side filter included in the multiplexer according to the comparative example of the present invention.

FIG. 8A is a circuit configuration diagram of the Band25 reception-side filter 512 of the multiplexer 500 according to the comparative example. Referring to FIG. 8A, the reception-side filter 512 includes a longitudinally coupled filter portion 206, a series arm resonator 205, and parallel arm resonators 255, 256, and 257.

The electrode configuration of the longitudinally coupled filter portion 206 is the same or substantially the same as that of the longitudinally coupled filter portion 203 of the reception-side filter 12. The series arm resonator 205 and the parallel arm resonators 255, 256, and 257 define a ladder filter portion.

The reception input terminal 62 is connected to the parallel arm resonator 255. The parallel arm resonator 255 has the largest capacitance, among the parallel arm resonators 255, 256, and 257. Accordingly, since the parallel arm resonator 255 has the maximum capacitance value, among the parallel arm resonators 255, 256, and 257, with no increase of the inductance value of the inductance element 521, the complex impedance of the reception-side filter 512 is capable of being made inductive while reducing the transmission loss from the common terminal 70 to the reception output terminal 20.

Figure 8B:
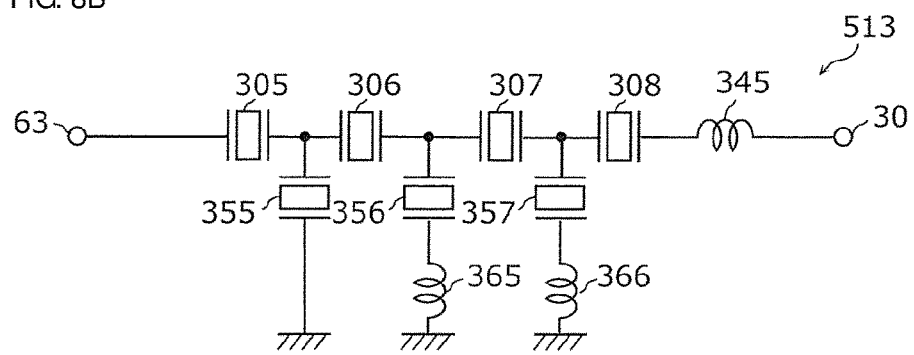
FIG. 8B is a circuit configuration diagram of a Band66 transmission-side filter included in the multiplexer according to the comparative example of the present invention.

FIG. 8B is a circuit configuration diagram of the Band66 transmission-side filter 513 of the multiplexer 500 according to the comparative example. Referring to FIG. 8B, the transmission-side filter 513 includes series arm resonators 305, 306, 307, and 308, parallel arm resonators 355, 356, and 357, and inductance elements 345, 365, and 366.

The series arm resonators 305, 306, 307, and 308 are disposed on the path connecting the transmission input terminal 30 to the transmission output terminal 63 and are connected in series to each other. The parallel arm resonators 355, 356, and 357 are disposed between the path and the reference terminal (the ground) and are connected so as to be parallel to each other. Because of the above-described connection configuration of the series arm resonators 305, 306, 307, and 308 and the parallel arm resonators 355, 356, and 357, the transmission-side filter 513 defines a ladder band pass filter. The inductance element 345 is connected in series between the transmission input terminal 30 and the series arm resonator 308. The inductance element 365 is connected between the parallel arm resonator 356 and the reference terminal. The inductance element 366 is connected between the parallel arm resonator 357 and the reference terminal.

The frequency of the spurious waves caused by the higher order mode, generated by the transmission-side filter 513, is positioned within the pass band of the transmission-side filter 515.

The transmission output terminal 63 is connected to the common terminal 70 (refer to FIG. 1). As illustrated in FIG. 8B, the transmission output terminal 63 is connected to the series arm resonator 305 and is directly connected to none of the parallel arm resonators 355, 356, and 357.

Figure 9:
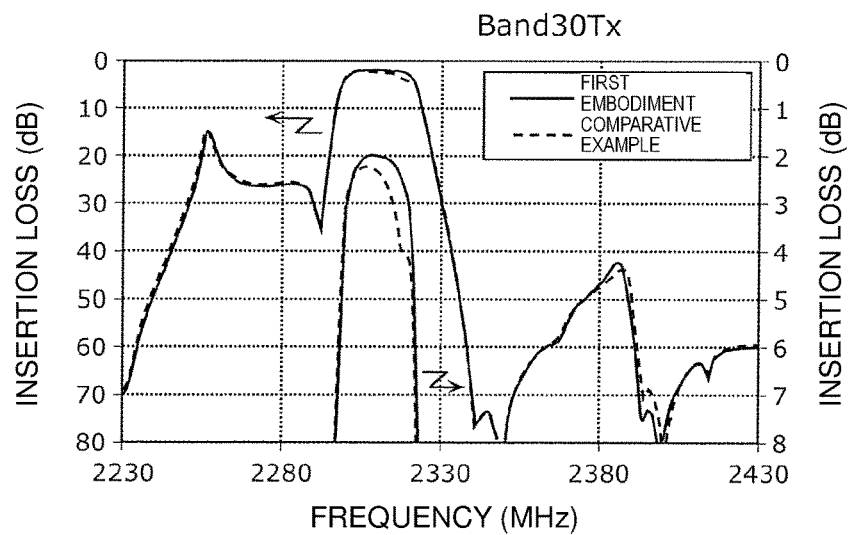
FIG. 9 is a graph illustrating a result of comparison of bandpass characteristics between the Band30 transmission-side filter according to the first preferred embodiment of the present invention and a Band30 transmission-side filter according to the comparative example.

FIG. 9 is a graph illustrating a result of a comparison of the bandpass characteristics between the Band30 transmission-side filter according to the first preferred embodiment and the Band30 transmission-side filter according to the comparative example. The bandpass characteristics of the transmission-side filter 15 of the multiplexer 1 according to the first preferred embodiment and the bandpass characteristics of the transmission-side filter 515 of the multiplexer 500 according to the comparative example are illustrated in FIG. 9.

The difference in the configuration between the multiplexer 1 according to the first preferred embodiment and the multiplexer 500 according to the comparative example will be described here.

Both of the multiplexer 1 and the multiplexer 500 have a problem in that the frequency of the spurious waves caused by the higher order mode in the Band66 transmission-side filter is positioned within the pass band of the Band30 transmission-side filter.

The inductance element 21 is connected in series between the Band66 transmission-side filter 13 and the common terminal 70 in the multiplexer 1, the parallel arm resonator 351 is closest to the common terminal 70, the parallel arm resonator 351 has the largest capacitance value, among the parallel arm resonators 351, 352, 353, and 354. No inductance element is provided between the Band25 reception-side filter 12 and the common terminal 70 and the series arm resonator 201 is closest to the common terminal 70.

In contrast, no inductance element is provided between the Band66 transmission-side filter 513 and the common terminal 70 in the multiplexer 500, and the series arm resonator 305 is closest to the common terminal 70. The inductance element 521 is connected in series between the Band25 reception-side filter 512 and the common terminal 70 in the multiplexer 500, the parallel arm resonator 255 is closest to the common terminal 70, and the parallel arm resonator 255 has the largest capacitance value, among the parallel arm resonators 255, 256, and 257.

As illustrated in FIG. 9, the insertion loss in the pass band (about 2,305 MHz to about 2,315 MHz) is greatly improved in the Band30 transmission-side filter 15 according to the first preferred embodiment, as compared to the Band30 transmission-side filter 515 according to the comparative example. More specifically, the maximum insertion loss in the pass band is about 3.2 dB in the transmission-side filter 515 according to the comparative example while the maximum insertion loss in the pass band is about 2.2 dB in the transmission-side filter 15 according to the first preferred embodiment and is improved by about 1.0 dB.

Factors of the above-described improvement will now be described.

Figure 10A:
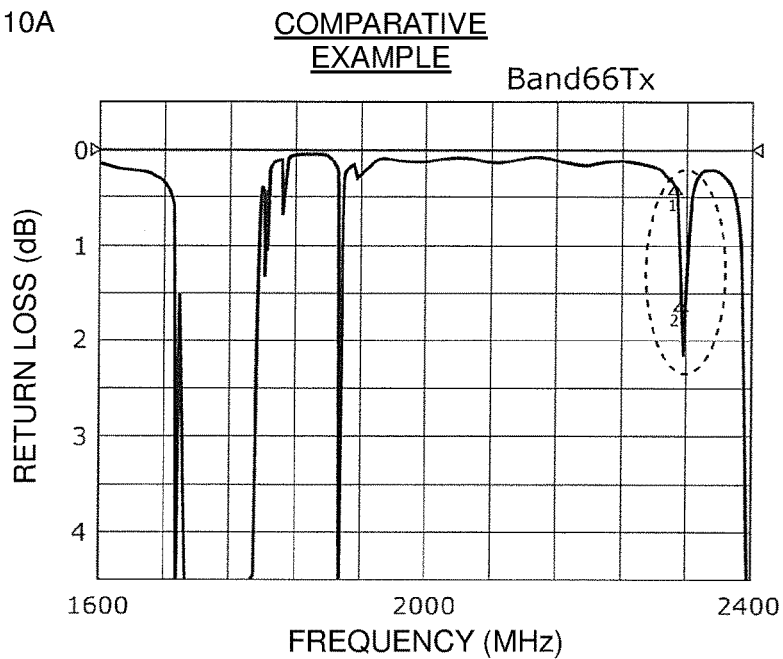
FIG. 10A is a graph illustrating reflection characteristics of the Band66 transmission-side filter included in the multiplexer according to the comparative example.
Figure 10B:
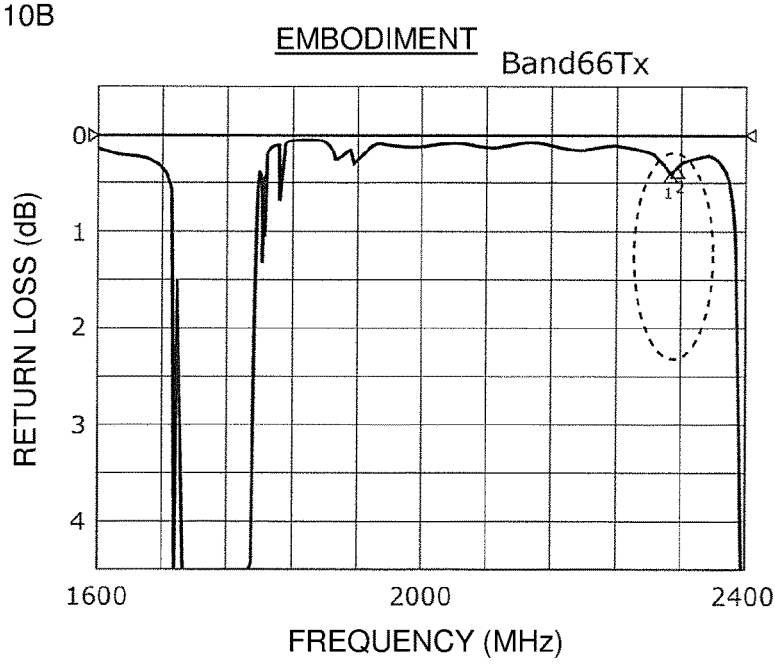
FIG. 10B is a graph illustrating the reflection characteristics of the Band66 transmission-side filter included in the multiplexer according to the first preferred embodiment of the present invention.

FIG. 10A is a graph illustrating reflection characteristics of the Band66 transmission-side filter 513 of the multiplexer 500 according to the comparative example. More specifically, the reflection characteristics when a single body of the Band66 transmission-side filter 513 (the Band66 transmission-side filter 513, which is commonly connected to no filter with the common terminal 70) is viewed from the common terminal 70 side are illustrated in FIG. 10A. FIG. 10B is a graph illustrating reflection characteristics of the Band66 transmission-side filter 13 included in the multiplexer 1 according to the first preferred embodiment. More specifically, the reflection characteristics when a single body of the series connection circuit including the inductance element 21 and the Band66 transmission-side filter 13 (the series connection circuit, which is commonly connected to no filter with the common terminal 70) is viewed from the common terminal 70 side are illustrated in FIG. 10B. In other words, the characteristics of the transmission-side filter 13 according to the first preferred embodiment are the reflection characteristics including the inductance element 21 in FIG. 10B.

FIG. 10A indicates that a local maximum point (spurious response) of return loss occurs in an area (a broken-line area in FIG. 10A) corresponding to the Band30 transmission pass band (2,305 MHz to 2,315 MHz), which is at the high frequency side of the pass band, in the transmission-side filter 513 according to the comparative example. This spurious response is the spurious waves caused by the higher order mode, which is caused by the energy locked into the piezoelectric film and the low acoustic velocity film in the elastic wave filter using, for example, the piezoelectric substrate having the laminated structure illustrated in FIG. 2A. The spurious response is not limited to the spurious waves caused by the higher order mode and may occur as the spurious waves caused by Rayleigh waves. In this case, the spurious waves occur at the low frequency side of the pass band.

In contrast, as illustrated in FIG. 10B, although a local maximum point (spurious response) of the return loss occurs in an area (a broken-line area in FIG. 10B) corresponding to the Band30 transmission pass band (about 2,305 MHz to about 2,315 MHz), which is at the high frequency side of the pass band, in the transmission-side filter 13 according to the first preferred embodiment, the local maximum value of the return loss is greatly reduced, as compared to that in the comparative example.

Figure 11:
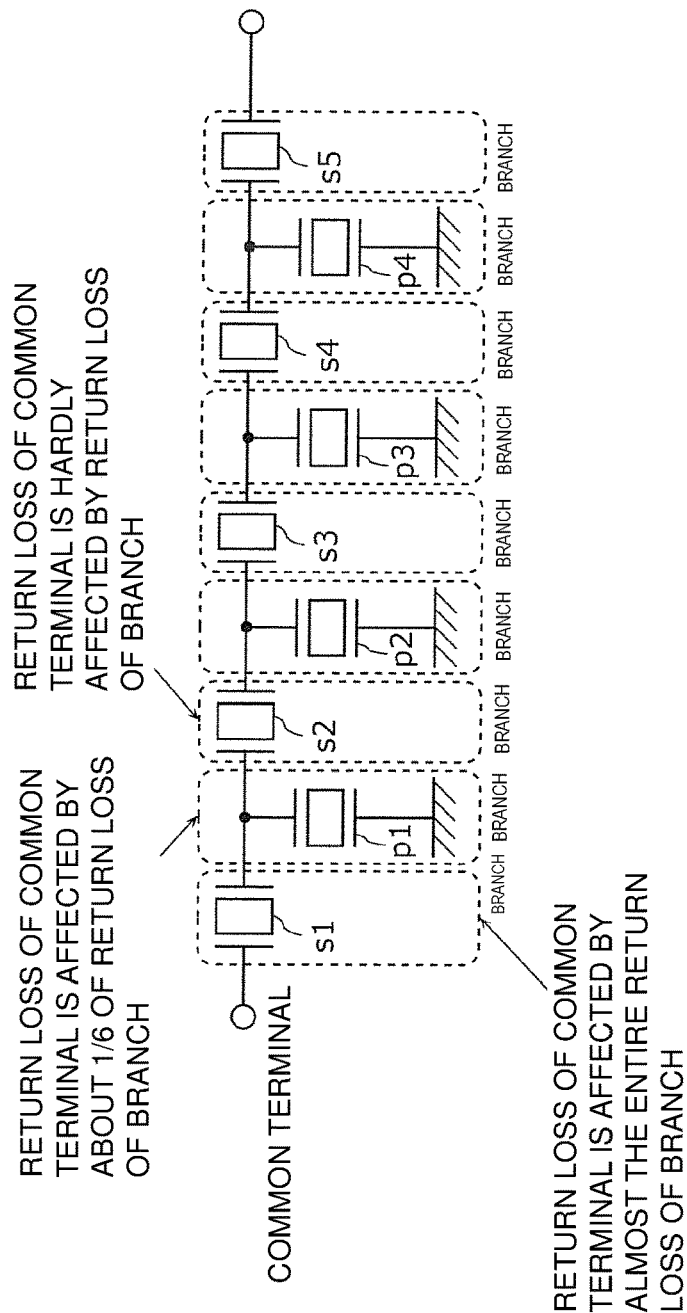
FIG. 11 is a diagram for describing the relationship between branches of a ladder elastic wave filter and the reflection characteristics.

FIG. 11 is a diagram for describing the relationship between branches of a ladder elastic wave filter and the reflection characteristics. A ladder elastic wave filter including five series arm resonators s1 to s5 and four parallel arm resonator p1 to p4 is illustrated in FIG. 11. When the reflection characteristics viewed from the common terminal are evaluated, the return loss viewed from the common terminal is affected by almost the entire return loss of the branch (the series arm resonator s1 in FIG. 11) itself closest to the common terminal, is affected by about ⅙ of the return loss of the branch (the parallel arm resonator p1 in FIG. 11) second closest to the common terminal, and is not substantially affected by the return loss of the branch (the series arm resonator s2 in FIG. 11) third closest to the common terminal.

The "branch" described in the present specification is one unit of the series arm resonators and the parallel arm resonators included in the ladder filter. If no parallel arm resonator is provided between multiple series arm resonators when the multiple series arm resonators are continuously connected to each other, the multiple series arm resonators are defined as one branch. If no series arm resonator is provided between multiple parallel arm resonators when the multiple parallel arm resonators are continuously connected to each other, the multiple parallel arm resonators are defined as one branch.

Figure 12A:
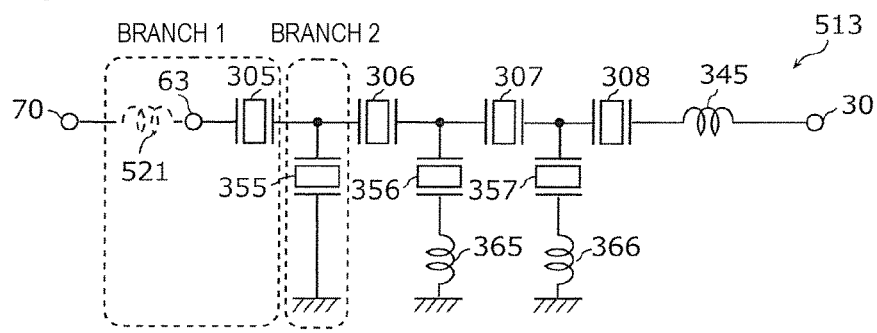
FIG. 12A is a circuit configuration diagram for describing branches of the Band66 transmission-side filter according to the comparative example.
Figure 12B:
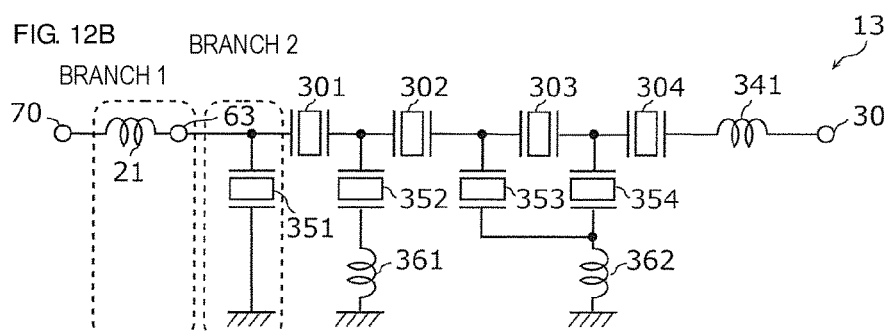
FIG. 12B is a circuit configuration diagram for describing the branches of the Band66 transmission-side filter according to the first preferred embodiment of the present invention.

FIG. 12A is a circuit configuration diagram for describing the branches of the Band66 transmission-side filter 513 according to the comparative example. FIG. 12B is a circuit configuration diagram for describing the branches of the Band66 transmission-side filter 13 according to the first preferred embodiment.

As illustrated in FIG. 12A, in the transmission-side filter 513 according to the comparative example, the series arm resonator 305 is included in a branch 1 closest to the common terminal 70 when viewed from the common terminal 70. In this case, the return loss when the transmission-side filter 513 is viewed from the common terminal 70 is affected by almost the entire return loss of the series arm resonator 305 itself and is greatly affected by the spurious response caused by the higher order mode of the series arm resonator 305. When the inductance element 521 is connected in series between the common terminal 70 and the transmission output terminal 63, as illustrated in FIG. 12A, the inductance element 521 and the series arm resonator 305 define the branch 1 closest to the common terminal 70. Even in this case, the return loss when the transmission-side filter 513 is viewed from the common terminal 70 is affected by almost the entire return loss of the series arm resonator 305 itself and is greatly affected by the spurious response caused by the higher order mode of the series arm resonator 305.

In contrast, as illustrated in FIG. 12B, in the transmission-side filter 13 according to the first preferred embodiment, only the inductance element 21 is included in the branch 1 closest to the common terminal 70 when viewed from the common terminal 70. In this case, although the return loss when the transmission-side filter 13 is viewed from the common terminal 70 is affected by almost the entire return loss of almost flat frequency characteristics, the return loss when the transmission-side filter 13 is viewed from the common terminal 70 is affected by only about ⅙ of the spurious waves caused by the higher order mode generated by the parallel arm resonator 351 in a branch 2.

Accordingly, in order to reduce or prevent an increase of the return loss caused by the spurious waves by connecting the inductance element in series between the transmission-side filter 13 and the common terminal 70, it is necessary to connect the parallel arm resonator as the resonator closest to the common terminal 70, as in the multiplexer 1 according to the first preferred embodiment.

In addition, when the inductance element 21 is connected in series and the parallel arm resonator is connected as the resonator closest to the common terminal 70, it is necessary to make the complex impedance of the transmission-side filter 13 (all the pass bands of the transmission-side filter 13 and of the other filters connected to the common terminal) inductive and to make the complex impedance of a combining circuit in which the filters other than the transmission-side filter 13 are connected to the common terminal 70 capacitive, thus achieving the impedance matching by complex conjugate between the inductive complex impedance and the capacitive complex impedance. In this case, in order not to degrade the insertion loss in the pass band of the transmission-side filter 13, the capacitance value of the parallel arm resonator 351 closest to the common terminal 70 is increased as much as possible within a range that does not affect the other filter characteristics and the inductance value of the inductance element 21 is decreased as much as possible to ensure the inductivity of the complex impedance of the transmission-side filter 13. It is necessary to decrease the capacitance values of the other parallel arm resonators 352, 353, and 354 by the amount corresponding to the increased capacitance value of the parallel arm resonator 351 in consideration of balance between the attenuation characteristics and the bandpass characteristics.

Table 1 indicates the electrode parameters of the transmission-side filter 13 according to the first preferred embodiment. Table 2 indicates the electrode parameters of the transmission-side filter 513 according to the comparative example.

TABLE 1

| Transmission-side filter 13 (first preferred embodiment) | Series arm resonator 301 | Series arm resonator 302 | Series arm resonator 303 | Series arm resonator 304 |
|---|---|---|---|---|
| Wavelength λ (μm) | 2.1417 | 2.1552 | 2.1405 | 2.1453 |
| Opposing length (μm) | 20.2 | 30.5 | 18.0 | 27.6 |
| The number of pairs | 85 | 300 | 70 | 248 |
| Electrode duty | 0.5 | 0.5 | 0.5 | 0.5 |

| | Parallel arm resonator 351 | Parallel arm resonator 352 | Parallel arm resonator 353 | Parallel arm resonator 354 |
|---|---|---|---|---|
| Wavelength λ (μm) | 2.2757 | 2.2392 | 2.2512 | 2.2729 |
| Opposing length (μm) | 26.3 | 21.4 | 35.4 | 23.0 |
| The number of pairs | 230 | 60 | 149 | 160 |
| Electrode duty | 0.5 | 0.5 | 0.5 | 0.5 |

TABLE 2

| Transmission-side filter 513 (comparative example) | Series arm resonator 305 | Series arm resonator 306 | Series arm resonator 307 | Series arm resonator 308 |
|---|---|---|---|---|
| Wavelength λ (μm) | 2.1486 | 2.1511 | 2.1585 | 2.1450 |
| Opposing length (μm) | 20.5 | 20.4 | 20.1 | 19.8 |
| The number of pairs | 90 | 150 | 90 | 130 |
| Electrode duty | 0.5 | 0.5 | 0.5 | 0.5 |

| | Parallel arm resonator 355 | Parallel arm resonator 356 | Parallel arm resonator 357 |
|---|---|---|---|
| Wavelength λ (μm) | 2.2531 | 2.2331 | 2.2464 |
| Opposing length (μm) | 27.8 | 23.8 | 37.7 |
| The number of pairs | 250 | 180 | 200 |
| Electrode duty | 0.5 | 0.5 | 0.5 |

The capacitance value of each resonator is calculated as the number of pairs X opposing length from the electrode parameters in Table 1. Specifically, when the capacitance value of the parallel arm resonator 351 in the transmission-side filter 13 according to the first preferred embodiment is normalized using one, the normalized capacitance value of the parallel arm resonator 352 is about 0.212, the normalized capacitance value of the parallel arm resonator 353 is about 0.871, and the normalized capacitance value of the parallel arm resonator 354 is about 0.607. Accordingly, degradation of the insertion loss in the pass band of the transmission-side filter 13 is reduced or prevented.

In addition, since the spurious waves caused by the higher order mode are decreased with the increasing capacitance of the resonator, making the capacitance value of the parallel arm resonator 351 higher than those of the other parallel arm resonators 352, 353, and 354 produces the secondary effect of further reducing or preventing the degradation of the insertion loss in the pass band of the Band30 transmission-side filter 15.

The configuration is described in the first preferred embodiment in which the multiplexer 1 is manufactured using the substrate having the laminated structure illustrated in FIG. 2A and which addresses the spurious response caused by the higher order mode occurring. However, the multiplexer according to the first preferred embodiment is not restricted by the kind of the substrate and the kind of the spurious waves. For example, although the spurious waves (having a frequency about 0.7 to about 0.8 times higher than the frequency generated in the main mode) caused by the Rayleigh waves may also occur in one elastic wave filter manufactured using the substrate having the above laminated structure, the insertion loss in the pass band of another filter which is connected to the common terminal with the one elastic wave filter and the pass band of which is at the low frequency side of that of the one elastic wave filter is capable of being improved.

In addition, as illustrated in FIG. 2B, in the elastic wave filter having the structure in which the IDT electrodes are provided on the LiNbO$_3$ single crystal substrate and the dielectric film (made of, for example, SiO$_2$) is provided on the single crystal substrate and the IDT electrodes, the spurious waves caused by the higher order mode occur because of the energy that is locked into the dielectric film. Also in this case, similar effects and advantages are achieved by using the characteristic configuration similar to that of the first preferred embodiment.

Although the hexaplexer of Band25+Band66+Band30 is exemplified in the first preferred embodiment, the present invention is not limited to this combination of the frequency bands. The present invention is applicable to, for example, a quadplexer of Band25+Band66, a quadplexer of Band1+Band3, or a hexaplexer of Band1+Band3+Band7.

The multiplexer 1 according to the first preferred embodiment includes the common terminal 70, the transmission-side filter 13 (the first elastic wave filter) and the transmission-side filter 15 (the second elastic wave filter) having different pass bands, and the inductance element 21. The transmission-side filter 13 includes the transmission input terminal 30, the transmission output terminal 63, the series arm resonators 301, 302, 303, and 304, and the parallel arm resonators 351, 352, 353, and 354. The frequency of the spurious waves generated by the transmission-side filter 13 is included in the pass band of the transmission-side filter 15. The transmission-side filter 15 is directly connected to the common terminal 70 and the transmission output terminal 63 is connected to the common terminal 70 with the inductance element 21 interposed therebetween. The transmission output terminal 63 is directly connected to the parallel arm resonator 351, among the parallel arm resonators 351, 352, 353, and 354, and the parallel arm resonator 351 has the largest capacitance, among the parallel arm resonators 351, 352, 353, and 354.

The inclusion of the frequency of the spurious waves generated by the transmission-side filter 13 in the pass band of the transmission-side filter 15 in the multiplexer 1 may possibly decrease a reflection factor in the pass band of the transmission-side filter when the transmission-side filter 13 is viewed from the common terminal 70 to increase the insertion loss in the pass band of the transmission-side filter 15.

However, with the above-described configuration, since the inductance element 21 is connected in series between the transmission-side filter 13 and the common terminal 70 and the resonator closest to the common terminal 70 is the parallel arm resonator 351, the increase in the return loss in the pass band of the transmission-side filter when the transmission-side filter 13 is viewed from the common terminal 70 is capable of being reduced or prevented. This is because the branch closer to the common terminal 70 in the transmission-side filter 13 has greater influence on the reflection characteristics when the transmission-side filter 13 is viewed from the common terminal 70. In other words, in the above-described configuration, the inductance element 21 is disposed between the transmission-side filter 13 and the common terminal 70 as the branch closest to the common terminal 70. The inductance element 21 does not generate the spurious waves and has the reflection characteristics, which have flat frequency characteristics, unlike the respective elastic wave resonators included in the transmission-side filter 13. Accordingly, the increase in the return loss in the pass band of the transmission-side filter 15 when the transmission-side filter 13 is viewed from the common terminal 70 is capable of being reduced or prevented. As a result, the bandpass characteristics of the transmission-side filter 15 are prevented from being degraded due to the spurious waves generated by the transmission-side filter 13.

In addition, since the complex conjugate relationship is established between the complex impedance in a certain pass band when a single body of the transmission-side filter is viewed from the common terminal 70 and the complex impedance in the certain pass band when the combining circuit composed of the elastic wave filters other than the transmission-side filter 13 is viewed from the common terminal 70, the impedance matching in the multiplexer 1 is improved or optimized. In order to establish the complex conjugate relationship between the complex impedance of the transmission-side filter 13, beginning from the parallel arm resonator 351, and the complex impedance of the combining circuit including the elastic wave filters having capacitive complex impedance, other than the transmission-side filter 13, the inductance value of the inductance element 21, which is connected in series, is preferably high in order to make the complex impedance when a single body of the transmission-side filter 13 is viewed from the common terminal 70 inductive. However, by contrast, the insertion loss in the pass band of the transmission-side filter is capable of being decreased with the decreasing inductance value of the inductance element 21. From this point of view, increasing the capacitance value of the parallel arm resonator 351 directly connected to the inductance element 21, among the parallel arm resonators 351, 352, 353, and 354 of the transmission-side filter 13, instead of increasing the inductance value of the inductance element 21, effectively makes the complex impedance when a single body of the transmission-side filter 13 is viewed from the common terminal 70 inductive, without increasing the inductance value of the inductance element 21. In contrast, in order to improve or optimize the bandpass characteristics of the transmission-side filter 13, the parallel arm resonators 352, 353, and 354 other than the parallel arm resonator 351 directly connected to the inductance element 21 are set so as to have relatively lower capacitance values.

With the above-described configuration, in the multiplexer 1 in which the multiple elastic wave filters are connected to the common terminal 70, it is possible to reduce or prevent the degradation of the bandpass characteristics of the transmission-side filter 15 due to the spurious waves generated by the transmission-side filter 13 while ensuring the low loss of the transmission-side filter 13.

The piezoelectric substrate 5 of the transmission-side filter 13 may preferably include, for example, the piezoelectric film 53 including one surface on which the IDT electrodes 54 of the series arm resonators 301, 302, 303, and 304 and the parallel arm resonators 351, 352, 353, and 354 are provided, the high acoustic velocity support substrate 51 in which the acoustic velocity of the bulk waves propagated in the high acoustic velocity support substrate 51 is higher than the acoustic velocity of the elastic waves propagated on the piezoelectric film 53, and the low acoustic velocity film 52 which is disposed between the high acoustic velocity support substrate 51 and the piezoelectric film 53 and in which the acoustic velocity of the bulk waves propagated in the low acoustic velocity film 52 is lower than the acoustic velocity of the bulk waves propagated in the piezoelectric film 53.

In order to achieve the impedance matching between the multiple elastic wave filters, for example, when the inductance element 21 is connected in series at the common terminal 70 side of the transmission-side filter 13, the circuit elements including an inductance element and a capacitance element are added to each elastic wave resonator. In this case, the Q factors of each elastic wave resonator may be equivalently or substantially equivalently decreased. However, even in such a case, the Q factors of each elastic wave resonator are capable of being maintained at a higher value in the laminated structure of the piezoelectric substrate 5. Accordingly, the elastic wave filters having the low loss in the pass bands are capable of being provided.

The pass band of the transmission-side filter 13 may be positioned at the low frequency side of the pass band of the transmission-side filter 15, and the spurious waves generated by the transmission-side filter 13 may be the spurious waves caused by the higher order mode.

With the above-described configuration, the bandpass characteristics of the transmission-side filter 15 are capable of being inhibited from being degraded due to the spurious waves caused by the higher order mode, which occur at the high frequency side of the pass band of the transmission-side filter and which are caused by the energy locked in the thickness direction of the piezoelectric film.

The pass band of one elastic wave filter may be positioned at the high frequency side of the pass band of another elastic wave filter, and the spurious waves generated by the one elastic wave filter may be the spurious waves caused by the Rayleigh waves.

With the above-described configuration, the bandpass characteristics of the other elastic wave filter are capable of being inhibited from being degraded due to the spurious waves caused by the Rayleigh waves, occurring at the low frequency side of the pass band of the one elastic wave filter.

Each of one or more series arm resonators and two or more parallel arm resonators defining the first elastic wave filter may preferably include, for example, the $LiNbO_3$ piezoelectric single crystal substrate 57, the IDT electrodes 54 provided on the piezoelectric single crystal substrate 57, and the protective layer 55 provided on the piezoelectric single crystal substrate 57 and the IDT electrodes 54.

With the above-described configuration, the first elastic wave filter is capable of having excellent frequency temperature characteristics.

In the multiplexer including the piezoelectric single crystal substrate 57, the pass band of one elastic wave filter may be positioned at the low frequency side of the pass bands of another elastic wave filter, and the spurious waves generated by the one elastic wave filter may be the spurious waves caused by the higher order mode.

With the above-described configuration, the bandpass characteristics of the other elastic wave filter are capable of being inhibited from being degraded due to the spurious waves caused by the higher order mode, which occur at the high frequency side of the pass band of the one elastic wave filter and which are caused by the energy locked into the protective layer 55.

Each of the filters other than the transmission-side filter 13 may include one or more series arm resonators disposed on a path between the two input-output terminals and one or more parallel arm resonators disposed between the path and the ground, and the common terminal 70 may be directly connected to only one series arm resonator, among the one or more series arm resonators and the one or more parallel arm resonators.

With the above-described configuration, the complex impedance in the certain pass band is made capacitive when the combining circuit in which the filters other than the transmission-side filter 13 are connected to the common terminal 70 is viewed from the common terminal 70. Accordingly, the high accuracy complex conjugate relationship is capable of being established between the inductive complex impedance when the transmission-side filter 13 is viewed from the common terminal 70 and the capacitive complex impedance when the combining circuit is viewed from the common terminal 70.

Second Preferred Embodiment

The multiplexer 1 according to the first preferred embodiment described above is applicable to a high-frequency front end circuit and a communication apparatus including the high-frequency front end circuit. Such a high-frequency front end circuit and such a communication apparatus will be described in a second preferred embodiment of the present invention.

Figure 13:
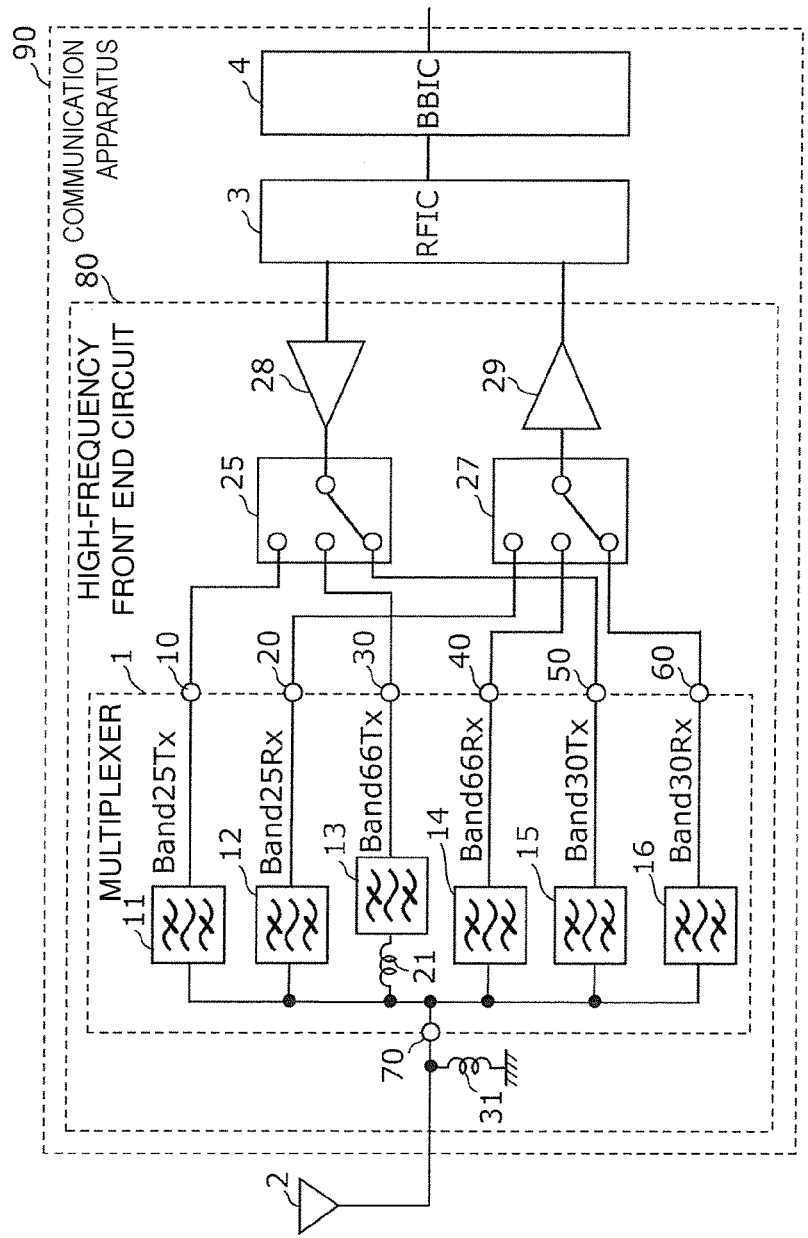
FIG. 13 is a diagram illustrating a configuration of a communication apparatus according to a second preferred embodiment of the present invention.

FIG. 13 is a diagram illustrating a configuration of a communication apparatus 90 according to the second preferred embodiment. Referring to FIG. 13, the communication apparatus 90 includes a high-frequency front end circuit 80, an radio-frequency (RF) signal processing circuit 3, and a baseband signal processing circuit (baseband integrated circuit (BBIC)) 4. The antenna element 2 to be connected to the communication apparatus 90 is also illustrated in FIG. 13.

The high-frequency front end circuit 80 includes the multiplexer 1 according to the first preferred embodiment, the inductance element 31, a reception-side switch 27, a transmission-side switch 26, a low noise amplifier circuit 29, and a power amplifier circuit 28.

The transmission-side switch 26 includes three selection terminals respectively connected to the transmission input terminals 10, 30, and 50 in the multiplexer 1 and a common terminal connected to the power amplifier circuit 28.

The reception-side switch 27 includes three selection terminals respectively connected to the reception output terminals 20, 40, and 60 in the multiplexer 1 and a common terminal connected to the low noise amplifier circuit 29.

Each of the transmission-side switch 26 and the reception-side switch 27 connects the common terminal to a signal path corresponding to a certain frequency band in response to a control signal from a controller (not illustrated) and is preferably defined by, for example, a single pole 3 throw (SP3T) switch. Only one selection terminal may not be connected to the common terminal and multiple selection terminals may be simultaneously connected to the common terminal. In other words, the high-frequency front end circuit 80 may support carrier aggregation.

The power amplifier circuit 28 is a transmission amplification circuit that amplifies a high-frequency signal (a high-frequency transmission signal here) supplied from the RF signal processing circuit 3 and supplies the high-frequency signal to the antenna element 2 via the transmission-side switch 26 and the multiplexer 1.

The low noise amplifier circuit 29 is a reception amplification circuit that amplifies a high-frequency signal (a high-frequency reception signal here) supplied through the antenna element 2, the multiplexer 1, and the reception-side switch 27 and supplies the high-frequency signal to the RF signal processing circuit 3.

The RF signal processing circuit 3 performs signal processing, such as down-conversion, for example, to the high-frequency signal supplied from the antenna element 2 through the reception signal path and supplies a reception signal generated through the signal processing to the baseband signal processing circuit 4. In addition, the RF signal processing circuit 3 performs signal processing, such as up-conversion, for example, to a transmission signal supplied from the baseband signal processing circuit 4 and supplies the high-frequency transmission signal generated through the signal processing to the power amplifier circuit 28. The RF signal processing circuit 3 is preferably, for example, an RFIC.

The signal processed in the baseband signal processing circuit 4 is used as, for example, an image signal to display an image or used as an audio signal for communication call.

The high-frequency front end circuit 80 may include other circuit elements between the respective components described above.

With the high-frequency front end circuit 80 and the communication apparatus 90 having the above-described configuration, the multiplexer 1 according to the first preferred embodiment described above enables reduction or prevention of the degradation of the bandpass characteristics of the transmission-side filter 15 due to the spurious waves generated by the transmission-side filter 13 while ensuring the low loss of the transmission-side filter 13.

The communication apparatus 90 may not include the baseband signal processing circuit 4 depending on the method of processing the high-frequency signal.

Although the multiplexer 1 according to the first preferred embodiment and the high-frequency front end circuit 80 and the communication apparatus 90 according to the second preferred embodiment are described above based on preferred embodiments of the present invention, the present invention is not limited to the above-described preferred embodiments. The following aspects resulting from making modifications to the above-described preferred embodiments are also included in the present invention.

For example, although the hexaplexer is exemplified as the multiplexer 1 in the above-described description, the present invention is applicable to a triplexer in which three filters commonly use one antenna connection terminal and a quadplexer in which two duplexers are commonly connected with a common terminal, for example. In other words, it is sufficient for the multiplexer to include at least two filters.

The multiplexers according to preferred embodiments of the present invention are not limited to the configuration including the transmission-side filter and the reception-side filter and may have a configuration including only the multiple transmission-side filters or only the multiple reception-side filters.

The transmission-side filter 13 is described as the first elastic wave filter and the transmission-side filter 15 is described as the second elastic wave filter in the first preferred embodiment. In other words, both of the first elastic wave filter and the second elastic wave filter are transmission filters in the first preferred embodiment. However, the present invention may be applied to any multiplexer regardless of, for example, the applications of the first elastic wave filter and the second elastic wave filter as long as the frequency of the spurious waves generated by the first elastic wave filter is within the pass band of the second elastic wave filter.

Preferred embodiments of the present invention are widely used for a communication device, such as a cellular phone, as a multiplexer, a high-frequency front end circuit, or a communication apparatus, for example, with low loss, which is applicable to multiband and multimode frequency standards.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer comprising:
   a common terminal;
   a first elastic wave filter and a second elastic wave filter having different pass bands; and
   an inductance element; wherein
   the first elastic wave filter includes:
      two input-output terminals;
      one or more series arm resonators disposed in a path between the two input-output terminals; and
      two or more parallel arm resonators disposed between the path and ground;
   a frequency of spurious waves generated by the first elastic wave filter is included in the pass band of the second elastic wave filter;
   the second elastic wave filter is directly connected to the common terminal;
   the input-output terminal at the common terminal side, among the two input-output terminals, is connected to the common terminal with the inductance element interposed therebetween and is directly connected to one parallel arm resonator, among the two or more parallel arm resonators; and
   the one parallel arm resonator has a largest capacitance, among the two or more parallel arm resonators.

2. The multiplexer according to claim 1, wherein
   a piezoelectric substrate of the first elastic wave filter includes:
      a piezoelectric film including one surface on which interdigital transducer electrodes of the one or more series arm resonators and the two or more parallel arm resonators are provided;
      a high acoustic velocity support substrate in which an acoustic velocity of bulk waves propagated in the high acoustic velocity support substrate is higher than an acoustic velocity of elastic waves propagated on the piezoelectric film; and
      a low acoustic velocity film which is disposed between the high acoustic velocity support substrate and the piezoelectric film, and in which an acoustic velocity of bulk waves propagated in the low acoustic velocity film is lower than an acoustic velocity of bulk waves propagated in the piezoelectric film.

3. The multiplexer according to claim 2, wherein
   the pass band of the first elastic wave filter is positioned at a low frequency side of the pass band of the second elastic wave filter; and
   the spurious waves generated by the first elastic wave filter are spurious waves caused by a higher order mode.

4. The multiplexer according to claim 2, wherein
the pass band of the first elastic wave filter is positioned at a high frequency side of the pass band of the second elastic wave filter; and
the spurious waves generated by the first elastic wave filter are spurious waves caused by Rayleigh waves.

5. The multiplexer according to claim 2, wherein
the pass band of the first elastic wave filter is a Band66 upstream frequency band in Long Term Evolution; and
the pass band of the second elastic wave filter is a Band30 upstream frequency band in the Long Term Evolution.

6. The multiplexer according to claim 1, wherein each of the one or more series arm resonators and the two or more parallel arm resonators includes a $LiNbO_3$ piezoelectric single crystal substrate, interdigital transducer electrodes provided on the piezoelectric single crystal substrate, and a dielectric film provided on the piezoelectric single crystal substrate and the interdigital transducer electrodes.

7. The multiplexer according to claim 6, wherein
the pass band of the first elastic wave filter is positioned at a low frequency side of the pass band of the second elastic wave filter; and
the spurious waves generated by the first elastic wave filter are spurious waves caused by a higher order mode.

8. The multiplexer according to claim 1, wherein
the second elastic wave filter includes one or more series arm resonators disposed on a path between two corresponding input-output terminals and one or more parallel arm resonators disposed between the path and the ground; and
the common terminal is directly connected to only one series arm resonator, among the one or more series arm resonators and the one or more parallel arm resonators.

9. The multiplexer according to claim 1, wherein the multiplexer includes a first duplexer including two filters including the first elastic wave filter and a second duplexer including two filters including the second elastic wave filter.

10. A high-frequency front end circuit comprising:
the multiplexer according to claim 1; and
an amplifier circuit connected to the multiplexer.

11. The high-frequency front end circuit according to claim 10, wherein
a piezoelectric substrate of the first elastic wave filter includes:
a piezoelectric film including one surface on which interdigital transducer electrodes of the one or more series arm resonators and the two or more parallel arm resonators are provided;
a high acoustic velocity support substrate in which an acoustic velocity of bulk waves propagated in the high acoustic velocity support substrate is higher than an acoustic velocity of elastic waves propagated on the piezoelectric film; and
a low acoustic velocity film which is disposed between the high acoustic velocity support substrate and the piezoelectric film, and in which an acoustic velocity of bulk waves propagated in the low acoustic velocity film is lower than an acoustic velocity of bulk waves propagated in the piezoelectric film.

12. The high-frequency front end circuit according to claim 11, wherein
the pass band of the first elastic wave filter is positioned at a low frequency side of the pass band of the second elastic wave filter; and
the spurious waves generated by the first elastic wave filter are spurious waves caused by a higher order mode.

13. The high-frequency front end circuit according to claim 11, wherein
the pass band of the first elastic wave filter is positioned at a high frequency side of the pass band of the second elastic wave filter; and
the spurious waves generated by the first elastic wave filter are spurious waves caused by Rayleigh waves.

14. The high-frequency front end circuit according to claim 11, wherein
the pass band of the first elastic wave filter is a Band66 upstream frequency band in Long Term Evolution; and
the pass band of the second elastic wave filter is a Band30 upstream frequency band in the Long Term Evolution.

15. The high-frequency front end circuit according to claim 10, wherein each of the one or more series arm resonators and the two or more parallel arm resonators includes a $LiNbO_3$ piezoelectric single crystal substrate, interdigital transducer electrodes provided on the piezoelectric single crystal substrate, and a dielectric film provided on the piezoelectric single crystal substrate and the interdigital transducer electrodes.

16. The high-frequency front end circuit according to claim 15, wherein
the pass band of the first elastic wave filter is positioned at a low frequency side of the pass band of the second elastic wave filter; and
the spurious waves generated by the first elastic wave filter are spurious waves caused by a higher order mode.

17. The high-frequency front end circuit according to claim 10, wherein
the second elastic wave filter includes one or more series arm resonators disposed on a path between two corresponding input-output terminals and one or more parallel arm resonators disposed between the path and the ground; and
the common terminal is directly connected to only one series arm resonator, among the one or more series arm resonators and the one or more parallel arm resonators.

18. The high-frequency front end circuit according to claim 10, wherein the multiplexer includes a first duplexer including two filters including the first elastic wave filter and a second duplexer including two filters including the second elastic wave filter.

19. A communication apparatus comprising:
a radio-frequency signal processing circuit that processes a high-frequency signal transmitted and received with an antenna element; and
the high-frequency front end circuit according to claim 10, which transmits the high-frequency signal between the antenna element and the radio-frequency signal processing circuit.

* * * * *